(12) United States Patent
Cady et al.

(10) Patent No.: US 6,576,992 B1
(45) Date of Patent: Jun. 10, 2003

(54) CHIP SCALE STACKING SYSTEM AND METHOD

(75) Inventors: James W. Cady, Austin, TX (US); James Wilder, Austin, TX (US); David L. Roper, Austin, TX (US); James Douglas Wehrly, Jr., Austin, TX (US); Julian Dowden, Austin, TX (US); Jeff Buchle, Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 10/005,581

(22) Filed: Oct. 26, 2001

(51) Int. Cl.[7] .................. H05K 7/06; H01L 23/12
(52) U.S. Cl. .................. 257/686; 257/723; 257/777; 257/700; 361/749; 361/783; 361/789; 361/803; 365/51; 174/254; 174/268; 438/109; 438/118
(58) Field of Search .................. 257/685, 686, 257/698, 700, 723, 777, 783; 438/109, 118, 125; 361/739, 749–751, 780, 789, 790, 784, 792–795, 803; 174/254, 268; 365/51, 63

(56) References Cited

U.S. PATENT DOCUMENTS

| | | | |
|---|---|---|---|
| 3,436,604 A | 4/1969 | Hyltin | 361/715 |
| 3,727,064 A | 4/1973 | Bottini | 250/551 |
| 3,746,934 A | 7/1973 | Stein | 361/810 |
| 3,772,776 A | 11/1973 | Weisenburger | 29/830 |
| 4,103,318 A | 7/1978 | Schwede | 361/707 |
| 4,288,841 A | 9/1981 | Gogal | 361/792 |
| 4,398,235 A | 8/1983 | Lutz et al. | 361/735 |
| 4,406,508 A | 9/1983 | Sadigh-Behzadi | 439/69 |
| 4,437,235 A | 3/1984 | McIver | 29/840 |
| 4,587,596 A * | 5/1986 | Bunnell | 361/749 |
| 4,696,525 A | 9/1987 | Coller et al. | 439/69 |
| 4,733,461 A | 3/1988 | Nakano | 29/830 |
| 4,821,007 A | 4/1989 | Fields et al. | 333/238 |
| 4,823,234 A | 4/1989 | Konishi et al. | 361/718 |
| 4,833,568 A | 5/1989 | Berhold | 361/749 |
| 4,862,249 A | 8/1989 | Carlson | 258/668 |
| 4,884,237 A | 11/1989 | Mueller et al. | 365/63 |
| 4,891,789 A | 1/1990 | Quattrini et al. | 365/63 |
| 4,911,643 A | 3/1990 | Perry et al. | 439/67 |
| 4,953,060 A | 8/1990 | Lauffer et al. | 361/388 |

(List continued on next page.)

FOREIGN PATENT DOCUMENTS

| | | |
|---|---|---|
| EP | 122-687 A | 10/1984 |
| EP | 0 298 211 A3 | 1/1989 |
| EP | 461-639 A | 12/1991 |

(List continued on next page.)

OTHER PUBLICATIONS

Introduction to FBGA Stacking for DDR/DDRII—CS–Stack from DPAC Technologies—Las Vegas Sep. 11, 2001—13 pages.

(List continued on next page.)

*Primary Examiner*—David L. Talbott
*Assistant Examiner*—John B. Vigushin

(57) ABSTRACT

The present invention stacks chip scale-packaged integrated circuits (CSPs) into modules that conserve board surface area. In a two-high CSP stack or module devised in accordance with a preferred embodiment of the present invention, a pair of CSPs is stacked, with one CSP above the other. The two CSPs are connected with a pair of flexible circuit structures. Each of the pair of flexible circuit structures is partially wrapped about a respective opposite lateral edge of the lower CSP of the module. The flex circuit pair connects the upper and lower CSPs and provides a thermal and electrical connection path between the module and an application environment such as a printed wiring board (PWB). The present invention may be employed to advantage in numerous configurations and combinations of CSPs in modules provided for high-density memories or high capacity computing.

42 Claims, 21 Drawing Sheets

U.S. PATENT DOCUMENTS

| | | | |
|---|---|---|---|
| 4,956,694 A | 9/1990 | Eide | 357/74 |
| 4,983,533 A | 1/1991 | Go | 438/12 |
| 5,012,323 A | 4/1991 | Farnworth | 257/723 |
| 5,016,138 A | 5/1991 | Woodman | 361/688 |
| 5,034,350 A | 7/1991 | Marchisi | 29/829 |
| 5,041,015 A | 8/1991 | Travis | 439/492 |
| 5,099,393 A | 3/1992 | Bentlage et al. | 361/485 |
| 5,104,820 A | 4/1992 | Go et al. | 438/109 |
| 5,138,430 A | 8/1992 | Gow, 3rd et al. | 257/712 |
| 5,159,434 A | 10/1992 | Kohno et al. | 257/676 |
| 5,198,888 A | 3/1993 | Sugano et al. | 257/686 |
| 5,222,014 A | 6/1993 | Lin | 361/414 |
| 5,241,454 A | 8/1993 | Ameen et al. | 361/744 |
| 5,247,423 A | 9/1993 | Lin et al. | 361/719 |
| 5,252,857 A * | 10/1993 | Kane et al. | 257/686 |
| 5,259,770 A | 11/1993 | Bates et al. | 439/66 |
| 5,262,927 A | 11/1993 | Chia et al. | 361/784 |
| 5,279,029 A | 1/1994 | Burns | 29/856 |
| 5,281,852 A | 1/1994 | Normington | 257/685 |
| 5,311,401 A | 5/1994 | Gates, Jr. et al. | 361/760 |
| 5,313,097 A | 5/1994 | Haj-Ali-Ahmadi et al. | 257/706 |
| 5,343,075 A | 8/1994 | Nishino | 257/686 |
| 5,347,428 A | 9/1994 | Carson et al. | 361/760 |
| 5,375,041 A | 12/1994 | McMahon | 361/749 |
| 5,377,077 A | 12/1994 | Burns | 361/704 |
| 5,394,010 A | 2/1995 | Tazawa et al. | 257/686 |
| 5,402,006 A | 3/1995 | O'Donley | 257/796 |
| 5,420,751 A | 5/1995 | Burns | 361/704 |
| 5,438,224 A * | 8/1995 | Papageorge et al. | 257/777 |
| 5,446,620 A | 8/1995 | Burns et al. | 361/704 |
| 5,455,740 A | 10/1995 | Burns | 361/735 |
| 5,475,920 A | 12/1995 | Burns et al. | 29/856 |
| 5,477,082 A * | 12/1995 | Buckley et al. | 257/679 |
| 5,479,318 A | 12/1995 | Burns | 361/735 |
| 5,484,959 A | 1/1996 | Burns | 174/524 |
| 5,493,476 A | 2/1996 | Burns | 361/735 |
| 5,499,160 A | 3/1996 | Burns | 361/704 |
| 5,514,907 A | 5/1996 | Moshayedi | 257/723 |
| 5,523,619 A | 6/1996 | McAllister et al. | 257/686 |
| 5,541,812 A | 7/1996 | Burns | 361/735 |
| 5,543,664 A | 8/1996 | Burns | 257/787 |
| 5,561,591 A | 10/1996 | Burns | 361/704 |
| 5,566,051 A | 10/1996 | Burns | 361/704 |
| 5,572,065 A | 11/1996 | Burns | 257/666 |
| 5,592,364 A | 1/1997 | Roane | 361/735 |
| 5,612,570 A | 3/1997 | Eide et al. | 257/686 |
| 5,631,193 A | 5/1997 | Burns | 29/827 |
| 5,644,161 A | 7/1997 | Burns | 257/668 |
| 5,654,877 A | 8/1997 | Burns | 361/713 |
| 5,776,797 A | 7/1998 | Nicewarner, Jr. et al. | 438/107 |
| 5,778,552 A | 7/1998 | Burns | 29/830 |
| 5,789,815 A * | 8/1998 | Tessier et al. | 257/723 |
| 5,801,437 A | 9/1998 | Burns | 257/685 |
| 5,828,125 A | 10/1998 | Burns | 257/668 |
| 5,835,988 A | 11/1998 | Ishii | 257/684 |
| 5,869,353 A | 2/1999 | Levy et al. | 438/109 |
| 5,917,709 A * | 6/1999 | Johnson et al. | 361/803 |
| 5,926,369 A | 7/1999 | Ingraham et al. | 361/699 |
| 6,014,316 A | 1/2000 | Eide | 361/735 |
| 6,025,642 A | 2/2000 | Burns | 257/686 |
| 6,028,352 A | 2/2000 | Eide | 257/686 |
| 6,028,365 A * | 2/2000 | Akram et al. | 257/778 |
| RE36,916 E | 10/2000 | Moshayedi | 257/723 |
| 6,157,541 A * | 12/2000 | Hacke | 361/749 |
| 6,172,874 B1 | 1/2001 | Bartilson | 361/719 |
| 6,178,093 B1 * | 1/2001 | Bhatt et al. | 361/795 |
| 6,187,652 B1 * | 2/2001 | Chou et al. | 438/455 |
| 6,205,654 B1 | 3/2001 | Burns | 29/830 |
| 6,225,688 B1 | 5/2001 | Kim et al. | 257/686 |
| 6,262,476 B1 | 7/2001 | Vidal | 257/686 |
| 6,262,895 B1 | 7/2001 | Forthun | 361/749 |
| 6,281,577 B1 | 8/2001 | Oppermann et al. | 257/724 |
| 6,300,679 B1 * | 10/2001 | Mukerji et al. | 257/738 |
| 6,323,060 B1 * | 11/2001 | Isaak | 438/109 |
| 6,208,521 B1 | 3/2002 | Nakatsuka | 361/749 |
| 6,376,769 B1 * | 4/2002 | Chung | 174/52.2 |
| 6,426,240 B2 * | 7/2002 | Isaak | 438/106 |
| 6,426,560 B1 * | 7/2002 | Kawamura et al. | 257/777 |
| 6,473,308 B2 | 10/2002 | Forthun | 361/749 |
| 6,489,687 B1 * | 12/2002 | Hashimoto | 257/777 |

FOREIGN PATENT DOCUMENTS

| | | |
|---|---|---|
| JP | 57-31166 A | 2/1982 |
| JP | 58-96756 A | 6/1983 |
| JP | 58-112348 A | 7/1983 |
| JP | 60-254762 | 12/1985 |
| JP | 62-230027 A | 10/1987 |
| JP | 63-153849 A | 6/1988 |
| JP | 4209562 | 7/1992 |
| JP | 5-21697 A | 1/1993 |
| RU | SU 834-957 | 5/1981 |

OTHER PUBLICATIONS

Dense–Pac Microsystems, 16 Megabit High Speed CMOS SRAM DPS1MX16MKn3.

Dense–Pac Microsystems, 256 Megabyte CMOS DRAM DP3ED32MS72RW5.

Dense–Pac Microsystems, Breaking Space Barriers, 3–D Technology 1993.

Dense–Pac Microsystems, DPS512X16A3, Ceramic 512K X 16 CMOS SRAM Module.

"Design Techniques for Ball Grid Arrays," William R. Newberry, Xynetix Design Systems, Inc.

"Chip Scale Packaging and Redistribution," Paul A. Magill, Glenn A. Rinne, J. Daniel Mis, Wayne C. Machon, Joseph W. Baggs, Unitive Electronics Inc.

"Alterable Interposer Block for Personalizing Stacked Module Interconnections," *IBM Technical Disclosure Bulletin*, vol. 30, No. 8, Jan. 8, 1988, pp. 373–374.

IBM Preliminary 168 Pin SDRAM Registered DIMM Functional Description & Timing Diagrams.

"3D Interconnection for Ultra–Dense Multichip Modules," Christian VAL, Thomson–CSF DCS Computer Division, Thierry Lemoine, Thomson–CSF RCM Radar Countermeasures Division.

"High Density Memory Packaging Technology High Speed Imaging Applications," Dean Frew, Texas Instruments Incorporated.

Teresa Technologies, Inc.—Semiconductor Intellectual Property, Chip Scale Packaging—Website pp. (3).

"Vertically–Intergrated Package," Alvin Weinberg, Pacesetter, Inc. and W. Kinzy Jones, Florida International University.

* cited by examiner

| | 1 | 2 | 3 | 4 | 5 | 6 (Reference) | 7 | 8 | 9 |
|---|---|---|---|---|---|---|---|---|---|
| | JEDEC Pinout for the X4 and X8 FBGA DDR-II Package | | | | | | | | |
| A | VDD | NU,RDQS# | VSS | X | X | X | VSSQ-S | DQS# | VDDQ |
| B | NC/DQ | VDDQ | DM/RDQS | X | X | X | DQS | VDDQ-S | NC/DQ |
| C | VDDQ | DQ | VSSQ | X | X | X | VSSQ | DQ | VDDQ |
| D | NC/DQ | VSSQ | DQ | X | X | X | DQ | VSSQ | NC/DQ |
| E | VSSDL | VREF | VDDL | X | X | X | VDD | CK | VSS |
| F | X | WE# | CAS | X | X | X | RAS# | CK | X |
| G | X | CS# | CKE | X | X | X | BA1# | BA0 | X |
| H | VSS | A10 | A1 | X | X | X | A2 | A0 | VDDQ |
| J | X | A3 | A5 | | | | A6 | A4 | X |
| K | X | A7 | A9 | | | | A11 | A8 | VSS |
| L | VDD | A12 | A14 | | | | A15 | A13 | X |

FIG. 17

| | | X8 Configuration 2Hi Using 2 x 4 parts | | | 8 Data Out | | | | |
|---|---|---|---|---|---|---|---|---|---|
| | 1 | 2 | 3 | 4 | 5 | 6 | 7 | 8 | 9 |
| A | VDD | NU,RDQS# | VSS | X | X | X | VSSQ-S | DQS# | VDDQ |
| B | DQ top | VDDQ | DM/RDQS | X | X | X | DQS | VDDQ-S | DQ top |
| C | VDDQ | DQ bot | VSSQ | X | X | X | VSSQ | DQ bot | VDDQ |
| D | DQ top | VSSQ | DQ bot | X | X | X | DQ bot | VSSQ | DQ top |
| E | VSSDL | VREF | VDDL | X | X | X | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

*FIG. 18*

X16 Configuration 2Hi Using 2 x 8 parts — 16 Data Out

| | 1 | 2 | 3 | 4 | 5 | 6 | 7 | 8 | 9 |
|---|---|---|---|---|---|---|---|---|---|
| A | VDD | RDQS# | VSS | RDQS0# | X | DQS1# | VSSQ-S | DQS0# | VDDQ |
| B | DQ top | VDDQ | DM1/RDQS1 | DM0/RDQS0 | X | DQS1 | DQS0 | VDDQ-S | DQ top |
| C | VDDQ | DQ top | VSSQ | DQ BOT | X | DQ BOT | VSSQ | DQ top | VDDQ |
| D | DQ top | VSSQ | DQ top | DQ BOT | X | DQ BOT | DQ top | VSSQ | DQ top |
| E | VSSDL | VREF | VDDL | DQ BOT | X | DQ BOT | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

CHIP SCALE STACKING SYSTEM AND METHOD

TECHNICAL FIELD

The present invention relates to aggregating integrated circuits and, in particular, to stacking integrated circuits in chip-scale packages.

BACKGROUND OF THE INVENTION

A variety of techniques are used to stack packaged integrated circuits. Some methods require special packages, while other techniques stack conventional packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages a have leads emergent from peripheral sides of the package, leaded packages occupy more than a minimal amount of circuit board surface area. Consequently, alternatives to leaded packages have recently gained market share.

One family of alternative packages is identified generally by the term "chip scale packaging" or CSP. CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP leads or contacts do not typically extend beyond the outline perimeter of the package. The absence of "leads" on package sides renders most stacking techniques devised for leaded packages inapplicable for CSP stacking.

CSP has enabled reductions in size and weight parameters for many applications. For example, micro ball grid array ($\mu$BGA) for flash and SRAM and wirebond on tape or rigid laminate CSPs for SRAM or EEPROM have been employed in a variety of applications. CSP is a broad category including a variety of packages from near chip scale to die-sized packages such as the die sized ball grid array (DSBGA) recently described in proposed JEDEC standard 95-1 for DSBGA. To meet the continuing demands for cost and form factor reduction with increasing memory capacities, CSP technologies that aggregate integrated circuits in CSP technology have recently been developed. For example, Sharp, Hitachi, Mitsubishi and Intel recently undertook support of what are called the S-CSP specifications for flash and SRAM applications. Those S-CSP specifications describe, however, stacking multiple die within a single chip scale package and do not provide a technology for stacking chip scale packages. Stacking integrated circuits within a single package requires specialized technology that includes reformulation of package internals and significant expense with possible supply chain vulnerabilities.

There are several known techniques for stacking packages articulated in chip scale technology. The assignee of the present invention has developed previous systems for aggregating $\mu$BGA packages in space saving topologies. The assignee of the present invention has systems for stacking BGA packages on a DIMM in a RAMBUS environment.

In U.S. Pat. No. 6,205,654 B1 owned by the assignee of the present invention, a system for stacking ball grid array packages that employs lead carriers to extend connectable points out from the packages is described. Other known techniques add structures to a stack of BGA-packaged ICs. Still others aggregate CSPs on a DIMM with angular placement of the packages. Such techniques provide alternatives, but require topologies of added cost and complexity.

U.S. Pat. No. 6,262,895 B1 to Forthun (the "Forthun patent") purports to disclose a technique for stacking chip scale packaged ICs. The Forthun patent discloses a "package" that exhibits a flex circuit wrapped partially about a CSP. The flex circuit is said to have pad arrays on upper and lower surfaces of the flex.

The flex circuit of the Forthun "package" has a pad array on its upper surface and a pad array centrally located upon its lower surface. On the lower surface of the flex there are third and fourth arrays on opposite sides from the central lower surface pad array. To create the package of Forthun, a CSP contacts the pad array located on the upper surface of the flex circuit. As described in the Forthun patent, the contacts on the lower surface of the CSP are pushed through "slits" in the upper surface pads and advanced through the flex to protrude from the pads of the lower surface array and, therefore, the bottom surface of the package. Thus, the contacts of the CSP serve as the contacts for the package. The sides of the flex are partially wrapped about the CSP to adjacently place the third and fourth pad arrays above the upper major surface of the CSP to create from the combination of the third and fourth pad arrays, a fifth pad array for connection to another such package. Thus, as described in the Forthun disclosure, a stacked module of CSPs created with the described packages will exhibit a flex circuit wrapped about each CSP in the module.

The previous known methods for stacking CSPs apparently have various deficiencies including complex structural arrangements and thermal or high frequency performance issues. Typically, the reliability of chip scale packaging is closely scrutinized. During such reliability evaluations, CSP devices often exhibit temperature cycle performance issues. CSPs are generally directly mounted on a PWB or other platform offset from the PWB by only the height of the ball or bump array emergent from the lower surface of the CSP. Consequently, stresses arising from temperature gradients over time are concentrated in the short lever arm of a low-height ball array. The issues associated with temp cycle performance in single CSPs will likely arise in those prior art CSP stacking solutions where the stack is offset from the PWB or application platform by only the height of the lower CSP ball grid array.

Thermal performance is also a characteristic of importance in CSP stacks. To increase dissipation of heat generated by constituent CSPs, the thermal gradient between the lower CSP and upper CSP in a CSP stack or module should be minimized. Prior art solutions to CSP stacking do not, however, address thermal gradient minimization in disclosed constructions.

What is needed, therefore, is a technique and system for stacking integrated circuits packaged in chip scale technology packaging that provides a thermally efficient, reliable structure that performs well at higher frequencies but does not add excessive height to the stack yet allows production at reasonable cost with readily understood and managed materials and methods.

SUMMARY OF THE INVENTION

The present invention stacks chip scale-packaged integrated circuits (CSPs) into modules that conserve PWB or other board surface area. The present invention can be used to advantage with CSP packages of a variety of sizes and configurations ranging from typical BGAs with footprints somewhat larger than the contained die to smaller packages such as, for example, die-sized packages such as DSBGA. Although the present invention is applied most frequently to chip scale packages that contain one die, it may be employed with chip scale packages that include more than one integrated circuit die.

In a two-high CSP stack or module devised in accordance with a preferred embodiment of the present invention, two CSPs are stacked, with one CSP disposed above the other. The two CSPs are connected with a pair of flex circuits. Each of the pair of flex circuits is partially wrapped about a respective opposite lateral edge of the lower CSP of the module. The flex circuit pair connects the upper and lower CSPs and provides a thermal and electrical path connection path between the module and an application environment such as a printed wiring board (PWB).

The present invention may be employed to advantage in numerous configurations and combinations of CSPs in modules provided for high-density memories or high capacity computing.

SUMMARY OF THE DRAWINGS

FIG. 17 illustrates a JEDEC pinout for DDR-II FBGA packages.

FIG. 18 illustrates the pinout of a module 10 in an alternative preferred embodiment of the present invention.

FIG. 19 illustrates the pinout of a module 10 in an alternative embodiment of the invention.

DESCRIPTION OF PREFERRED EMBODIMENTS

Figure 1:
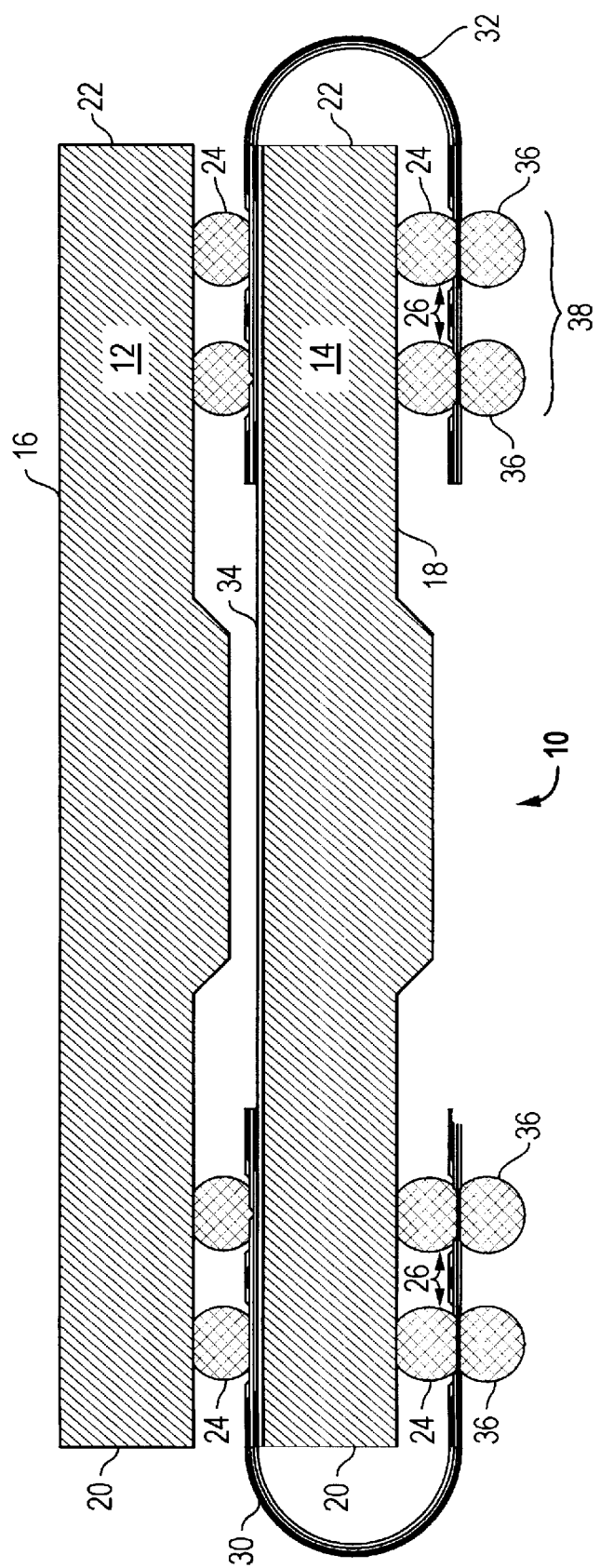
FIG. 1 is an elevation view of module 10 devised in accordance with a preferred embodiment of the present invention.

FIG. 1 is an elevation view of module 10 devised in accordance with a preferred embodiment of the present invention. Module 10 is comprised of upper CSP 12 and lower CSP 14. Each of CSPs 12 and 14 have an upper surface 16 and a lower surface 18 and opposite lateral sides 20 and 22.

Figure 2:
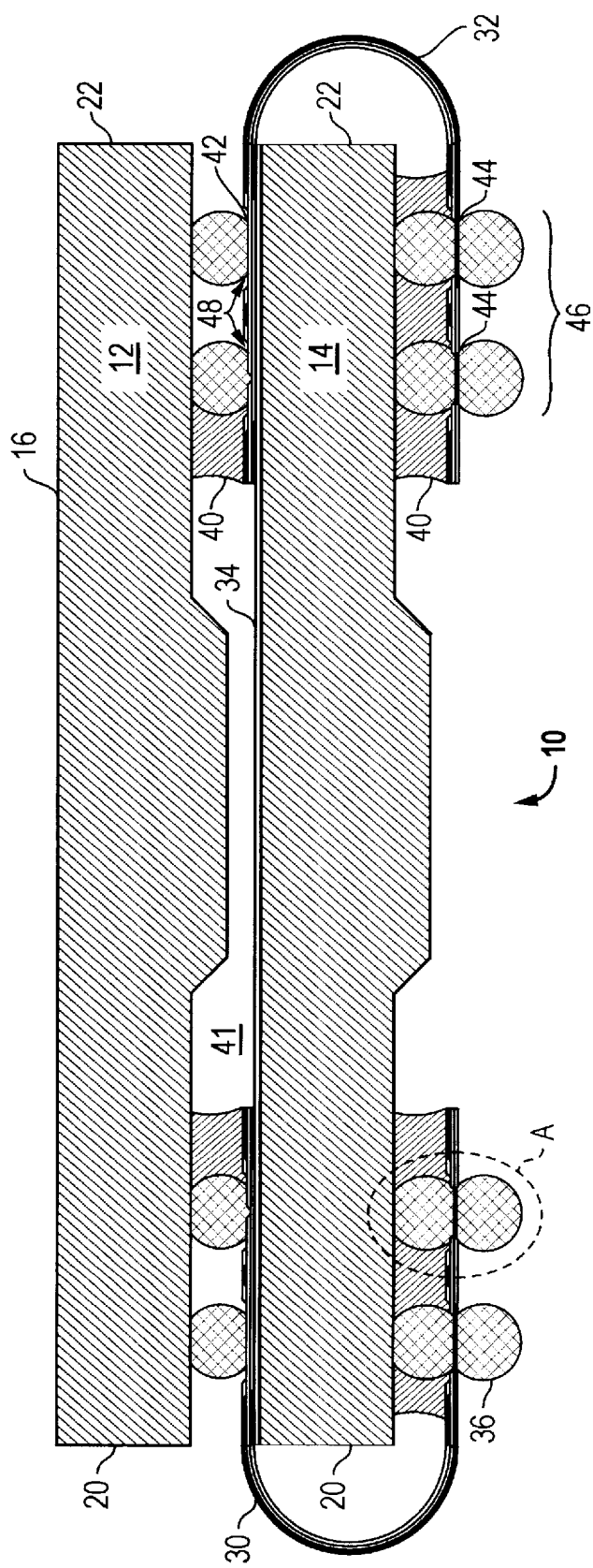
FIG. 2 is an elevation view of module 10 devised in accordance with a preferred embodiment of the present invention.

The invention is used with CSP packages of a variety of types and configurations such as, for example, those that are die-sized, as well those that are near chip-scale as well as the variety of ball grid array packages known in the art. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. Later figures show embodiments of the invention that employ CSPs of other configurations as an example of one other of the many alternative CSP configurations with which the invention may be employed. The invention may be employed to advantage in the wide range of CSP configurations available in the art where an array of connective elements is emergent from at least one major surface. The invention is advantageously employed with CSPs that contain memory circuits but may be employed to advantage with logic and computing circuits where added capacity without commensurate PWB or other board surface area consumption is desired.

Typical CSPs, such as, for example, ball-grid-array ("BGA"), micro-ballgrid array ("µBGA"), and fine-pitch ball grid array ("FBGA") packages have an array of connective contacts embodied, for example, as leads, bumps, solder balls, or balls that extend from lower surface 18 of a plastic casing in any of several patterns and pitches. An external portion of the connective contacts is often finished with a ball of solder. Shown in FIG. 1 are CSP contacts 24 along lower surfaces 18 of CSPs 12 and 14. CSP contacts 24 provide connection to the integrated circuit within the respective packages. Collectively, CSP contacts 24 comprise CSP array 26 shown as to lower CSP 14 in the depicted particular package configuration as CSP arrays 26$_1$ and 26$_2$ which collectively comprise CSP array 26.

In FIG. 1, flex circuits ("flex", "flex circuits" or "flexible circuit structures") 30 and 32 are shown partially wrapped about lower CSP 14 with flex 30 partially wrapped over lateral side 20 of lower CSP 14 and flex 32 partially wrapped about lateral side 22 of lower CSP 14. Lateral sides 20 and 22 may be in the character of sides or may, if the CSP is especially thin, be in the character of an edge. Any flexible or conformable substrate with a multiple internal layer connectivity capability may be used as a flex circuit in the invention. The entire flex circuit may be flexible or, as those of skill in the art will recognize, a PCB structure made flexible in certain areas to allow conformability around lower CSP 14 and rigid in other areas for planarity along CSP surfaces may be employed as an alternative flex circuit in the present invention. For example, structures known as rigid-flex may be employed.

Portions of flex circuits 30 and 32 are fixed to upper surface 16 of lower CSP 14 by adhesive 34 which is shown as a tape adhesive, but may be a liquid adhesive or may be placed in discrete locations across the package. Preferably, adhesive 34 is thermally conductive. Adhesives that include a flux are used to advantage in assembly of module 10. Layer 34 may also be a thermally conductive medium to encourage heat flow between the CSPs of module 10.

Flex circuits 30 and 32 are multi-layer flexible circuit structures that have at least two conductive layers. Preferably, the conductive layers are metal such as alloy 110. The use of plural conductive layers provides advantages as will be seen and the creation of a distributed capacitance across module 10 intended to reduce noise or bounce effects that can, particularly at higher frequencies, degrade signal integrity, as those of skill in the art will recognize. Module 10 of FIG. 1 has module contacts 36 collectively identified as module array 38.

FIG. 2 shows a module 10 devised in accordance with a preferred embodiment of the invention. FIG. 2 illustrates use of a conformal media 40 provided in a preferred embodiment to assist in creating conformality of structural areas of module 10. Planarity of the module is improved by conformal media 40. Preferably, conformal media 40 is thermally conductive. In alternative embodiments, thermal spreaders or a thermal medium may be placed as shown by reference 41. Identified in FIG. 2 are upper flex contacts 42 and lower flex contacts 44 that are at one of the conductive layers of flex circuits 30 and 32. Upper flex contacts 42 and lower flex contacts 44 are conductive material and, preferably, are solid metal. Lower flex contacts 44 are collectively lower flex contact array 46. Upper flex contacts 42 are collectively upper flex contact array 48. Only some of upper flex contacts 42 and lower flex contacts 44 are identified in FIG. 2 to preserve clarity of the view. It should be understood that each of flex circuits 30 and 32 have both upper flex contacts 42 and lower flex contacts 44. Lower flex contacts 44 are employed with lower CSP 14 and upper flex contacts 42 are employed with upper CSP 12. FIG. 2 has an area marked "A" that is subsequently shown in enlarged depiction in FIG. 3.

Figure 3:
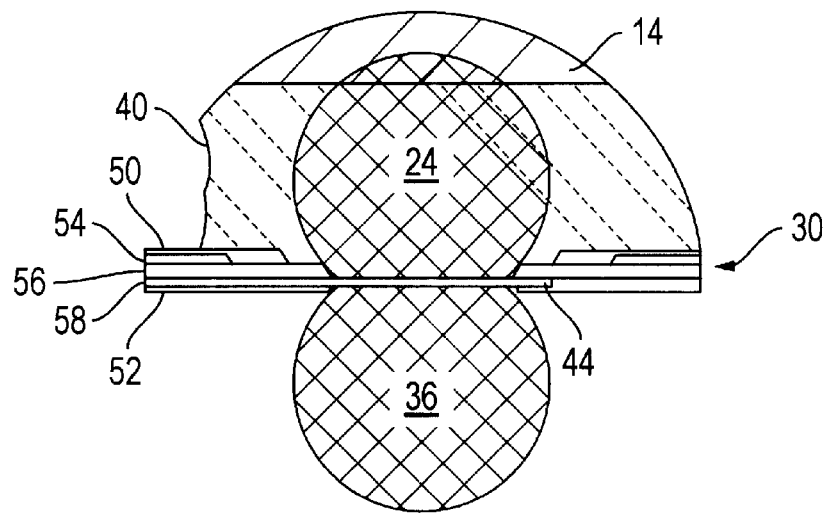
FIG. 3 depicts, in enlarged view, the area marked "A" in FIG. 2.

FIG. 3 depicts in enlarged view, the area marked "A" in FIG. 2. FIG. 3 illustrates the connection between example CSP contact 24 and module contact 36 through lower flex contact 44 to illustrate the solid metal path from lower CSP 14 to module contact 36 and, therefore, to an application PWB to which module is connectable. As those of skill in the art will understand, heat transference from module 10 is thereby encouraged.

With continuing reference to FIG. 3, CSP contact 24 and module contact 36 together offset module 10 from an application platform such as a PWB. The combined heights of CSP contact 24 and module contact 36 provide a moment arm longer than the height of a single CSP contact 24 alone. This provides a longer moment arm through which temperature-gradient-over-time stresses (such as typified by temp cycle), can be distributed.

Flex 30 is shown in FIG. 3 to be comprised of multiple layers. Flex 30 has a first outer surface 50 and a second outer surface 52. Flex circuit 30 has at least two conductive layers interior to first and second outer surfaces 50 and 52. There may be more than two conductive layers in flex 30 and flex 32. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred.

As depicted in FIG. 3 and seen in more detail in later figures, lower flex contact 44 is preferably comprised from metal at the level of second conductive layer 58 interior to second outer surface 52. Lower flex contact 44 is solid metal in a preferred embodiment and is comprised of metal alloy such as alloy 110. This results in a solid metal pathway from lower CSP 14 to an application board thereby providing a significant thermal pathway for dissipation of heat generated in module 10.

Figure 4:
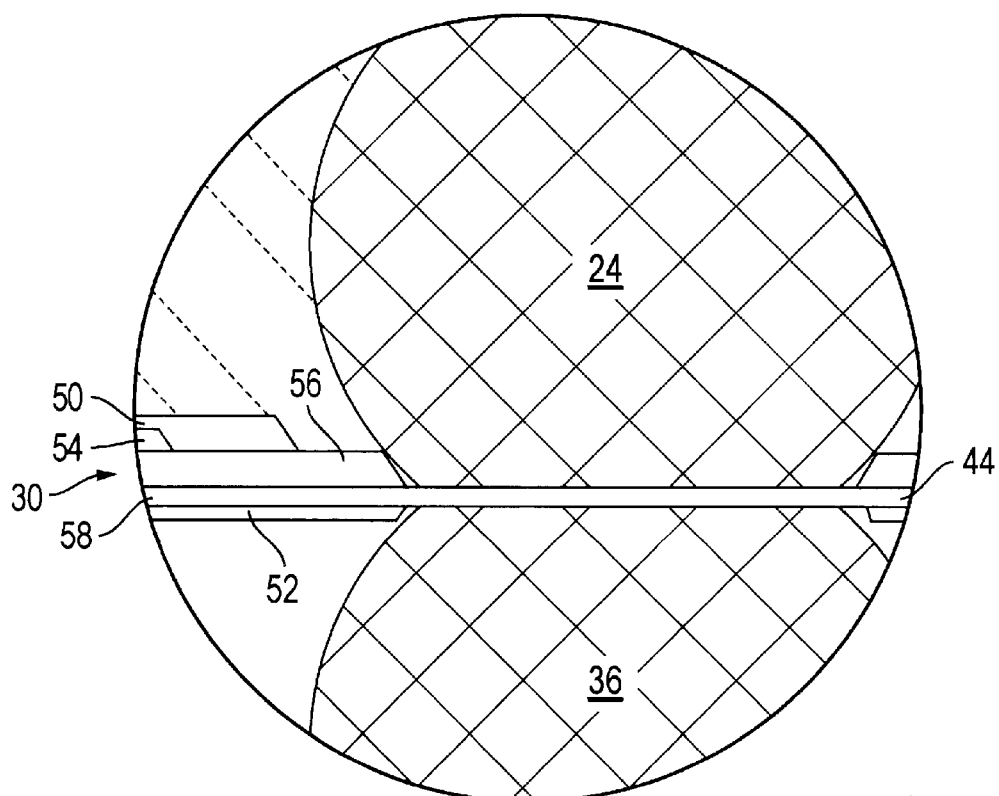
FIG. 4 is an enlarged detail of an exemplar connection in a preferred embodiment of the present invention.

FIG. 4 is an enlarged detail of an exemplar connection between example CSP contact 24 and example module contact 36 through lower flex contact 44 to illustrate the solid metal path from lower CSP 14 to module contact 36 and, therefore, to an application PWB to which module 10 is connectable. As shown in FIG. 4, lower flex contact 44 is at second conductive layer 58 that is interior to first and second outer surface layers 50 and 52 respectively, of flex circuit 30.

Figure 5:
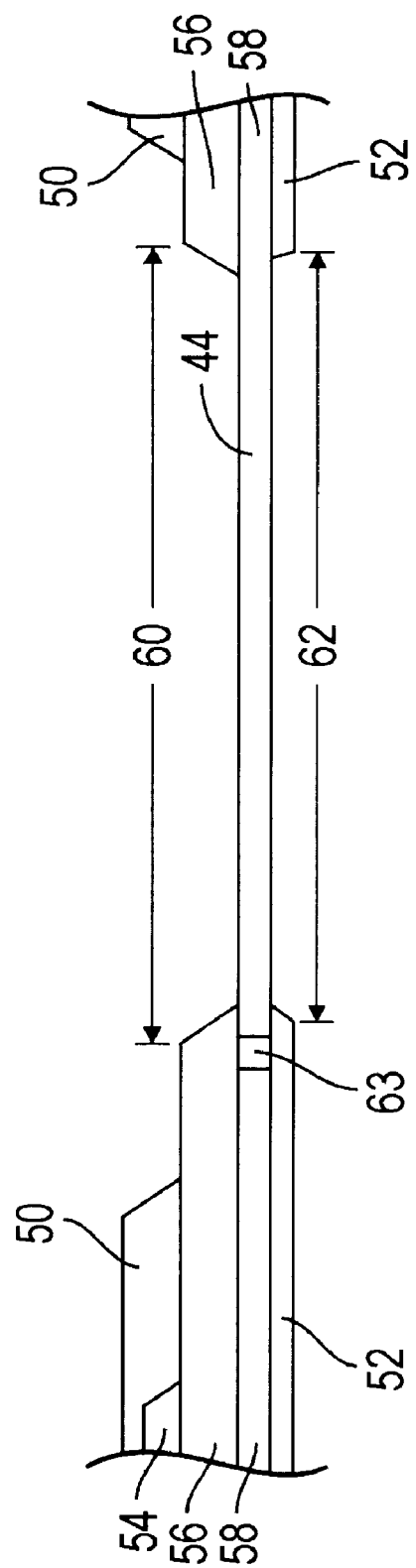
FIG. 5 is an enlarged depiction of an exemplar area around a lower flex contact in a preferred embodiment of the present invention.

FIG. 5 is an enlarged depiction of an exemplar area around a lower flex contact 44 in a preferred embodiment. Windows 60 and 62 are opened in first and second outer surface layers 50 and 52 respectively, to provide access to particular lower flex contacts 44 residing at the level of second conductive layer 58 in the flex. The upper flex contacts 42 are contacted by CSP contacts 24 of upper CSP 12. Lower flex contacts 44 and upper flex contacts 42 are particular areas of conductive material (preferably metal such as alloy 110) at the level of second conductive layer 58 in the flex. Upper flex contacts 42 and lower flex contacts 44 are demarked in second conductive layer 58 and, as will be shown in subsequent Figs., may be connected to or isolated from the conductive plane of second conductive layer 58. Demarking a lower flex contact 44 from second conductive layer 58 is represented in FIG. 5 by demarcation gap 63 shown at second conductive layer 58. Where an upper or lower flex contact 42 or 44 is not completely isolated from second conductive layer 58, demarcation gaps do not extend completely around the flex contact as shown, for example, by lower flex contacts 44C in later FIG. 12. CSP contacts 24 of lower CSP 14 pass through a window 60 opened through first outer surface layer 50, first conductive layer 54, and intermediate layer 56, to contact an appropriate lower flex contact 44. Window 62 is opened through second outer surface layer 52 through which module contacts 36 pass to contact the appropriate lower flex contact 44.

Respective ones of CSP contacts 24 of upper CSP 12 and lower CSP 14 are connected at the second conductive layer 58 level in flex circuits 30 and 32 to interconnect appropriate signal and voltage contacts of the two CSPs. Respective CSP contacts 24 of upper CSP 12 and lower CSP 14 that convey ground (VSS) signals are connected at the first conductive layer 54 level in flex circuits 30 and 32 by vias that pass through intermediate layer 56 to connect the levels as will subsequently be described in further detail. Thereby, CSPs 12 and 14 are connected. Consequently, when flex circuits 30 and 32 are in place about lower CSP 14, respective CSP contacts 24 of each of upper and lower CSPs 12 and 14 are in contact with upper and lower flex contacts 42 and 44, respectively. Selected ones of upper flex contacts 42 and lower flex contacts 44 are connected. Consequently, by being in contact with lower flex contacts 44, module contacts 36 are in contact with both upper and lower CSPs 12 and 14.

In a preferred embodiment, module contacts 36 pass through windows 62 opened in second outer layer 52 to contact lower CSP contacts 44. In some embodiments, as will be later shown, module 10 will exhibit a module contact array 38 that has a greater number of contacts than do the constituent CSPs of module 10. In such embodiments, some of module contacts 36 may contact lower flex contacts 44 that do not contact one of the CSP contacts 24 of lower CSP 14 but are connected to CSP contacts 24 of upper CSP 12. This allows module 10 to express a wider datapath than that expressed by the constituent CSPs 12 or 14. A module contact 36 may also be in contact with a lower flex contact 44 to provide a location through which different levels of CSPs in the module may be enabled when no unused CSP contacts are available or convenient for that purpose.

In a preferred embodiment, first conductive layer 54 is employed as a ground plane, while second conductive layer 58 provides the functions of being a signal conduction layer and a voltage conduction layer. Those of skill will note that roles of the first and second conductive layers may be reversed with attendant changes in windowing and use of commensurate interconnections.

As those of skill will recognize, interconnection of respective voltage CSP contacts 24 of upper and lower CSPs 12 and 14 will provide a thermal path between upper and lower CSPs to assist in moderation of thermal gradients through module 10. Such flattening of the thermal gradient curve across module 10 is further encouraged by connection of common ground CSP contacts 24 of upper and lower CSPs 12 and 14 through first conductive layer 54. Those of skill will notice that between first and second conductive layers 54 and 58 there is at least one intermediate layer 56 that, in a preferred embodiment, is a polyimide. Placement of such an intermediate layer between ground-conductive first conductive layer 54 and signal/voltage conductive second conductive layer 58 provides, in the combination, a distributed capacitance that assists in mitigation of ground bounce phenomena to improve high frequency performance of module 10.

Figure 6:
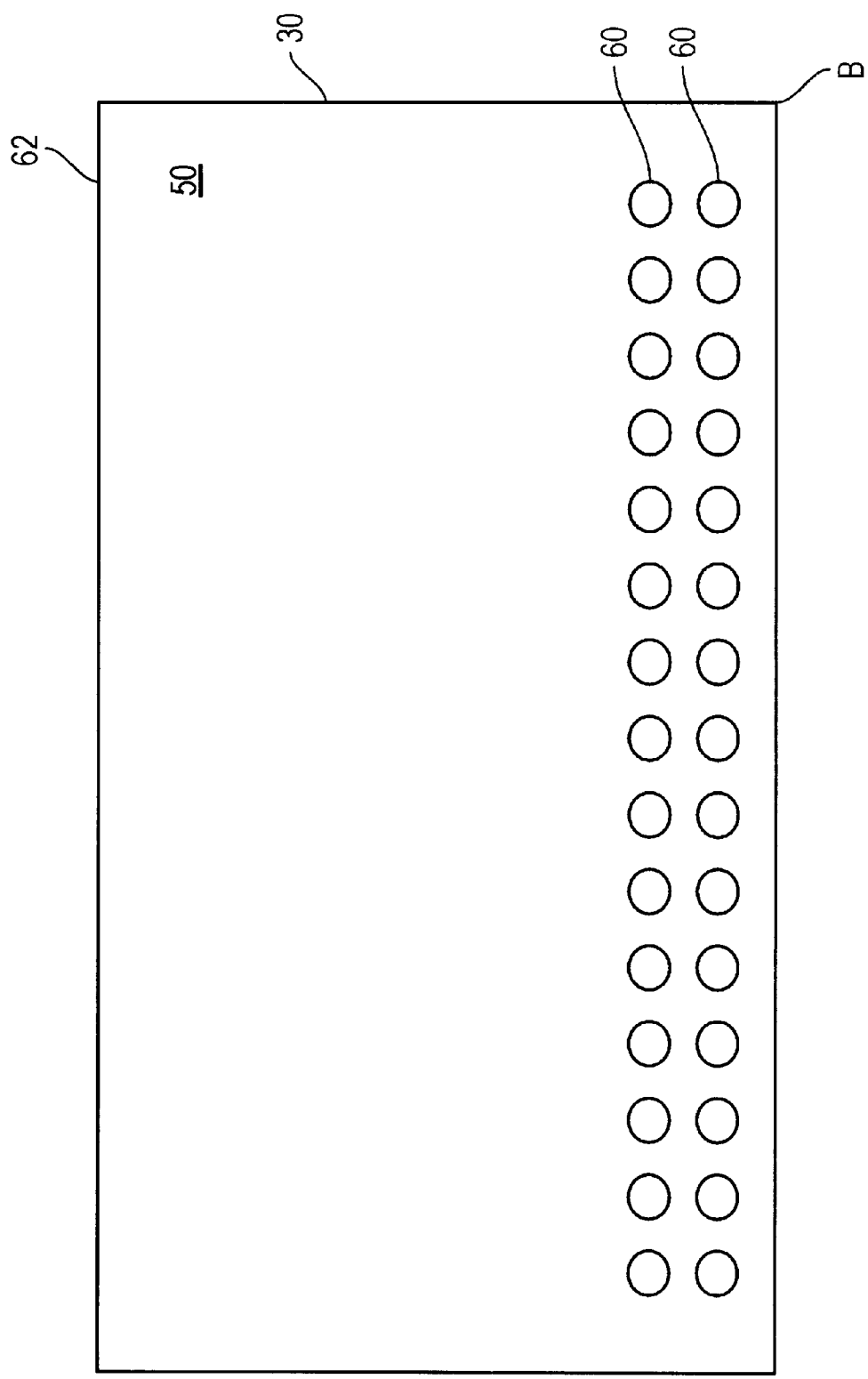
FIG. 6 depicts a first outer surface layer of a flex circuit employed in a preferred embodiment of the present invention.

In a preferred embodiment, FIG. 6 depicts first outer surface layer 50 of flex 30 (i.e., left side of FIG. 1). The view is from above the flex looking down into flex 30 from the perspective of first conductive layer 54. Throughout the Figs., the location reference "B" is to orient views of layers of flex 30 to those of flex 32 as well as across layers. Windows 60 are opened through first outer surface layer 50, first conductive layer 54, and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with selected lower flex contacts 44. Lower flex contacts 44 provide several types of connection in a preferred embodiment as will be explained with reference to later FIG. 12. When module 10 is assembled, a portion of flex 30 will be wrapped about lateral side 20 of lower CSP 14 to place edge 62 above upper surface 16 of lower CSP 14.

Figure 7:
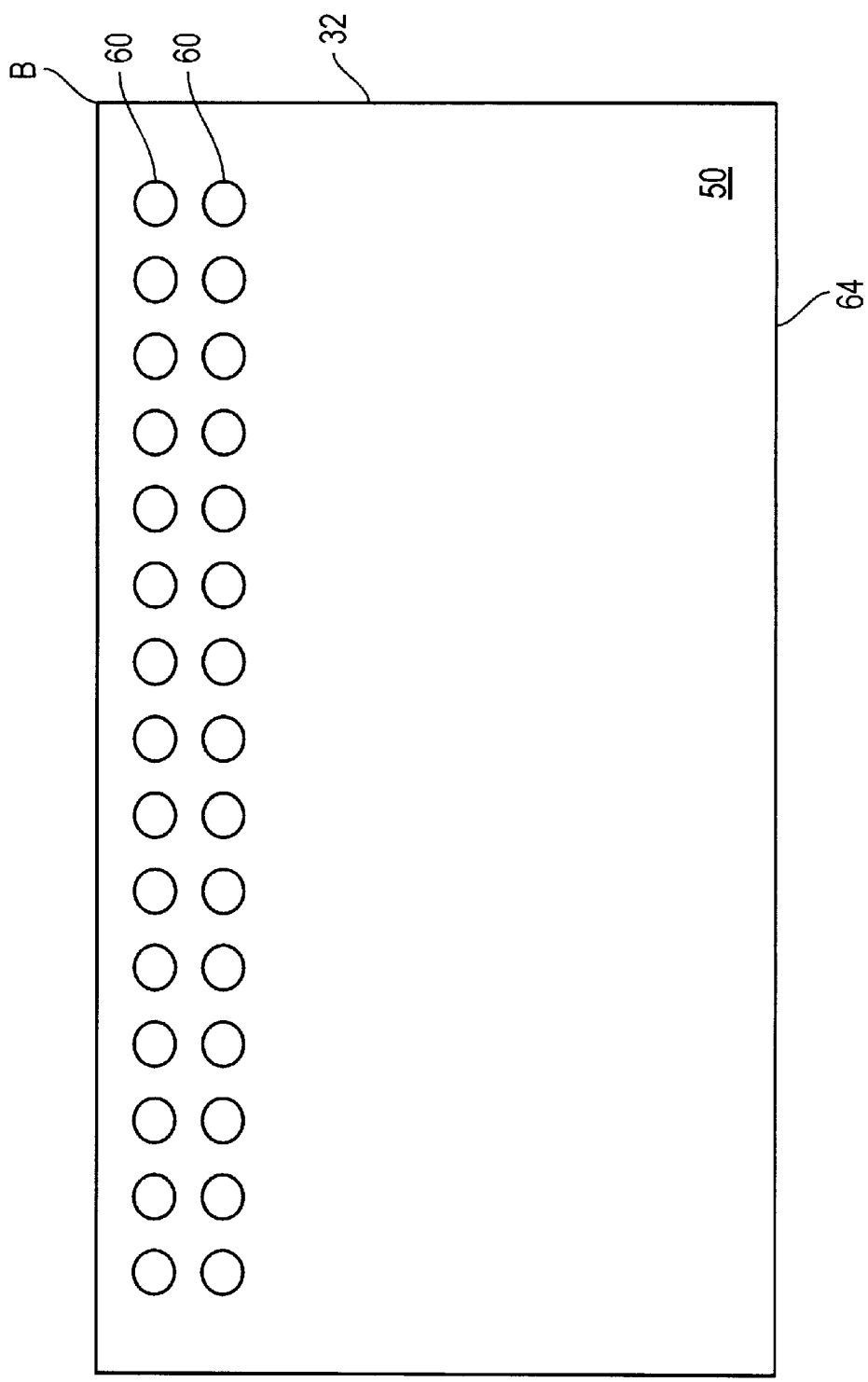
FIG. 7 depicts a first outer surface layer of a flex circuit employed in a preferred embodiment of the present invention.

In a preferred embodiment, FIG. 7 depicts first outer surface layer 50 of flex 32 (i.e., right side of FIG. 1). The view is from above the flex looking down into flex 32 from the perspective of first conductive layer 54. The location reference "B" relatively orients the views of FIGS. 6 and 7. The views of FIGS. 6 and 7 may be understood together with the reference marks "B" of each view being placed nearer each other than to any other corner of the other view of the pair of views of the same layer. As shown in FIG. 7, windows 60 are opened through first outer surface layer 50, first conductive layer 54 and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with lower flex contacts 44. Lower flex contacts 44 provide several types of connection in a preferred embodiment as will be explained with reference to later FIG. 12. When module 10 is assembled, a portion of flex 32 will be wrapped about lateral side 22 of lower CSP 14 to place edge 64 above upper surface 16 of lower CSP 14.

Figure 8:
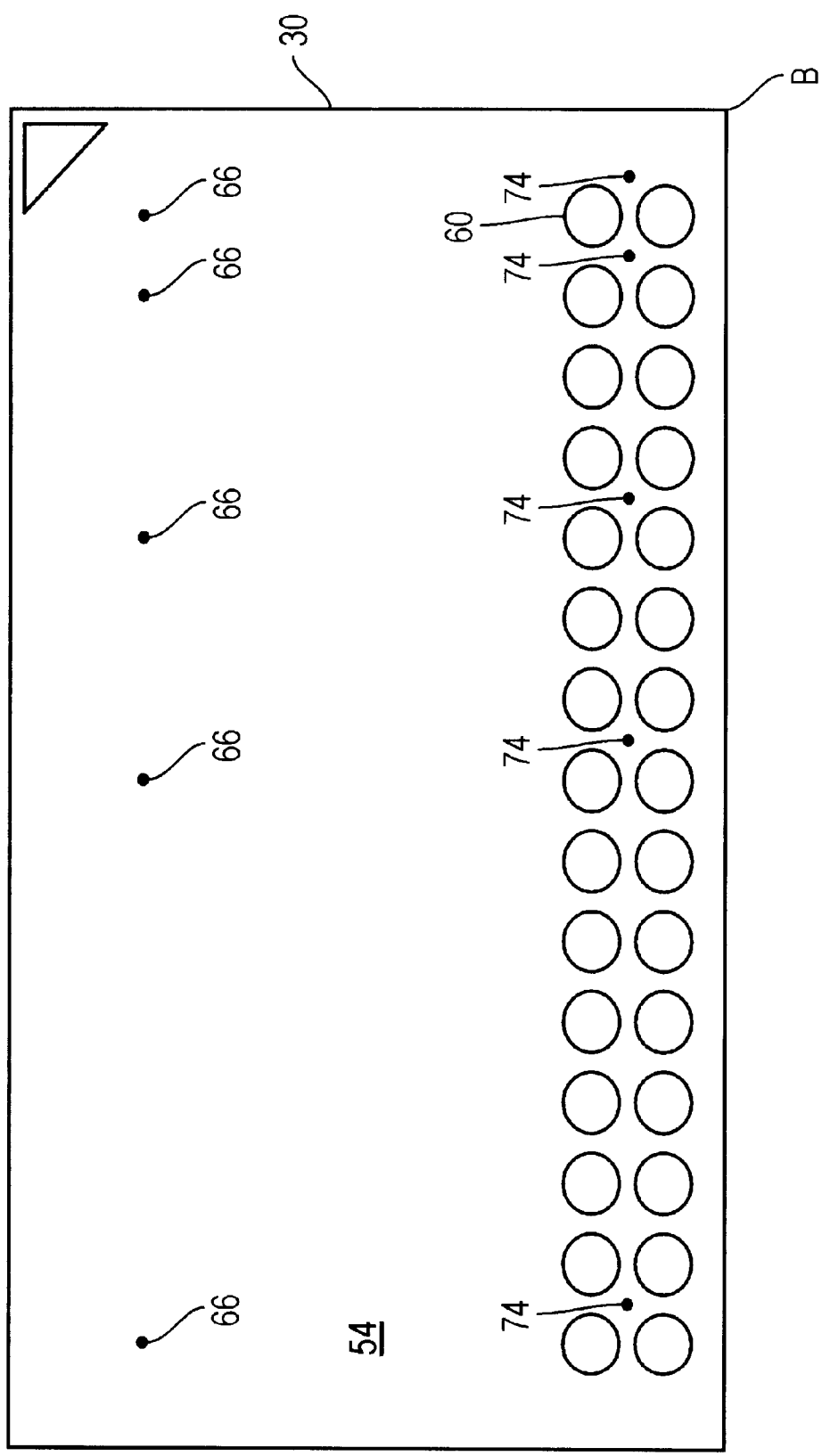
FIG. 8 depicts a first conductive layer of a flex circuit employed in a preferred embodiment of the present invention.

FIG. 8 depicts first conductive layer 54 of flex 30. Windows 60 continue the opened orifice in flex 30 through which CSP contacts 24 of lower CSP 14 pass to reach second conductive layer 58 and, therefore, selected lower flex contacts 44 at the level of second conductive layer 58.

Those of skill will recognize that as flex 30 is partially wrapped about lateral side 20 of lower CSP 14, first conductive layer 54 becomes, on the part of flex 30 disposed above upper surface 16 of lower CSP 14, the lower-most conductive layer of flex 30 from the perspective of upper CSP 12. In the depicted embodiment, those CSP contacts 24 of upper CSP 12 that provide ground (VSS) connections are connected to the first conductive layer 54. First conductive layer 54 lies beneath, however, second conductive layer 58 in that part of flex 30 that is wrapped above lower CSP 14. Consequently, some means must be provided for connection of the upper flex contact 42 to which ground-conveying CSP contacts 24 of upper CSP 12 are connected and first conductive layer 54. Consequently, in the depicted preferred embodiment, those upper flex contacts 42 that are in contact with ground-conveying CSP contacts 24 of upper CSP 12 have vias that route through intermediate layer 56 to reach first conductive layer 54. The sites where those vias meet first conductive layer 54 are identified in FIG. 8 as vias 66. These vias may be "on-pad" or coincident with the flex contact 42 to which they are connected. Those of skill will note a match between the vias 66 identified in FIG. 8 and vias 66 identified in the later view of second conductive layer 58 of the depicted preferred embodiment. In a preferred embodiment, vias 66 in coincident locations from Fig. to Fig. are one via. For clarity of the view, depicted vias in the figures are shown larger in diameter than in manufactured embodiments. As those of skill will recognize, the connection between conductive layers provided by vias (on or off pad) may be provided any of several well-known techniques such as plated holes or solid lines or wires and need not literally be vias.

Also shown in FIG. 8 are off-pad vias 74. Off-pad vias 74 are disposed on first conductive layer 54 at locations near, but not coincident with selected ones of windows 60. Unlike vias 66 that connect selected ones of upper flex contacts 42 to first conductive layer 54, off-pad vias 74 connect selected ones of lower flex contacts 44 to first conductive layer 54. In the vicinity of upper flex contacts 42, second conductive layer 58 is between the CSP connected to module 10 by the upper flex contacts 42 (i.e., upper CSP 12) and first conductive layer 54. Consequently, vias between ground-conveying upper flex contacts 42 and first conductive layer 54 may be directly attached to the selected upper flex contacts 42 through which ground signals are conveyed. In contrast, in the vicinity of lower flex contacts 44, first conductive layer 54 is between the CSP connected to module 10 by the lower flex contacts 44 (i.e., lower CSP 14) and second conductive layer 58. Consequently, vias between ground-conveying lower flex contacts 44 and first conductive layer 54 are offset from the selected lower flex contacts 44 by off-pad vias 74 shown in offset locations.

Figure 9:
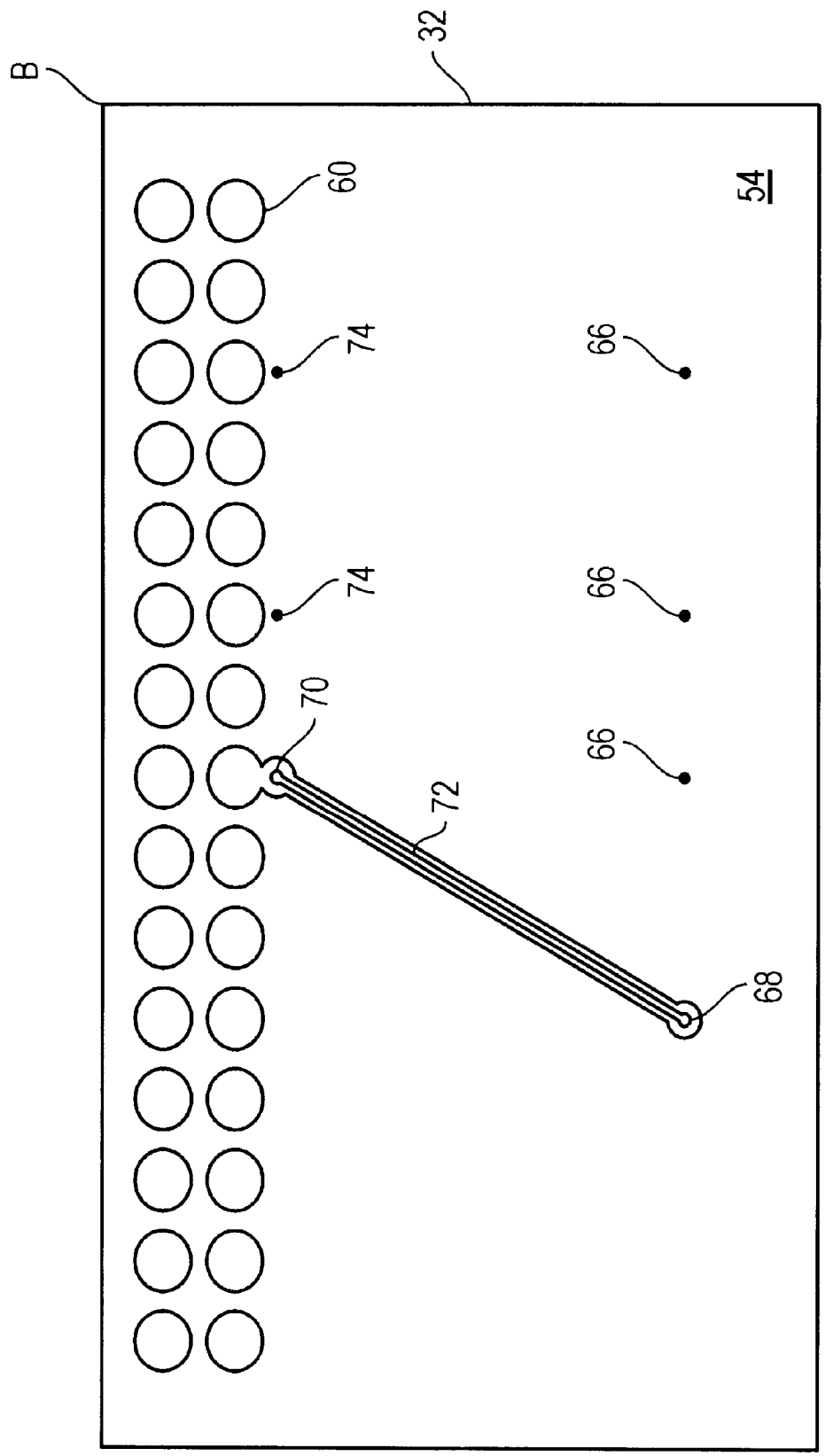
FIG. 9 illustrates a first conductive layer of a flex circuit employed in a preferred embodiment of the present invention.

FIG. 9 illustrates first conductive layer 54 of flex 32. The location reference marks "B" are employed to relatively orient FIGS. 8 and 9. Windows 60, vias 66 and off-pad vias 74 are identified in FIG. 9. Also shown in FIG. 9, are enable vias 68 and 70 and enable trace 72. Enable via 70 is connected off-pad to a selected lower flex contact 44 that corresponds, in this preferred embodiment, to an unused CSP contact 24 of lower CSP 14 (i.e., a N/C). A module contact 36 at that site conveys an enable signal (C/S) for upper CSP 12 through the selected lower flex contact 44 (which is at the level of second conductive layer 58) to off-pad enable via 70 that conveys the enable signal to first conductive layer 54 and thereby to enable trace 72. Enable trace 72 further conveys the enable signal to enable via 68 which extends through intermediate layer 56 to selected upper flex contact 42 at the level of second conductive layer 58 where contact is made with the C/S pin of upper CSP 12. Thus, upper and lower CSPs 12 and 14 may be independently enabled.

Figure 10:
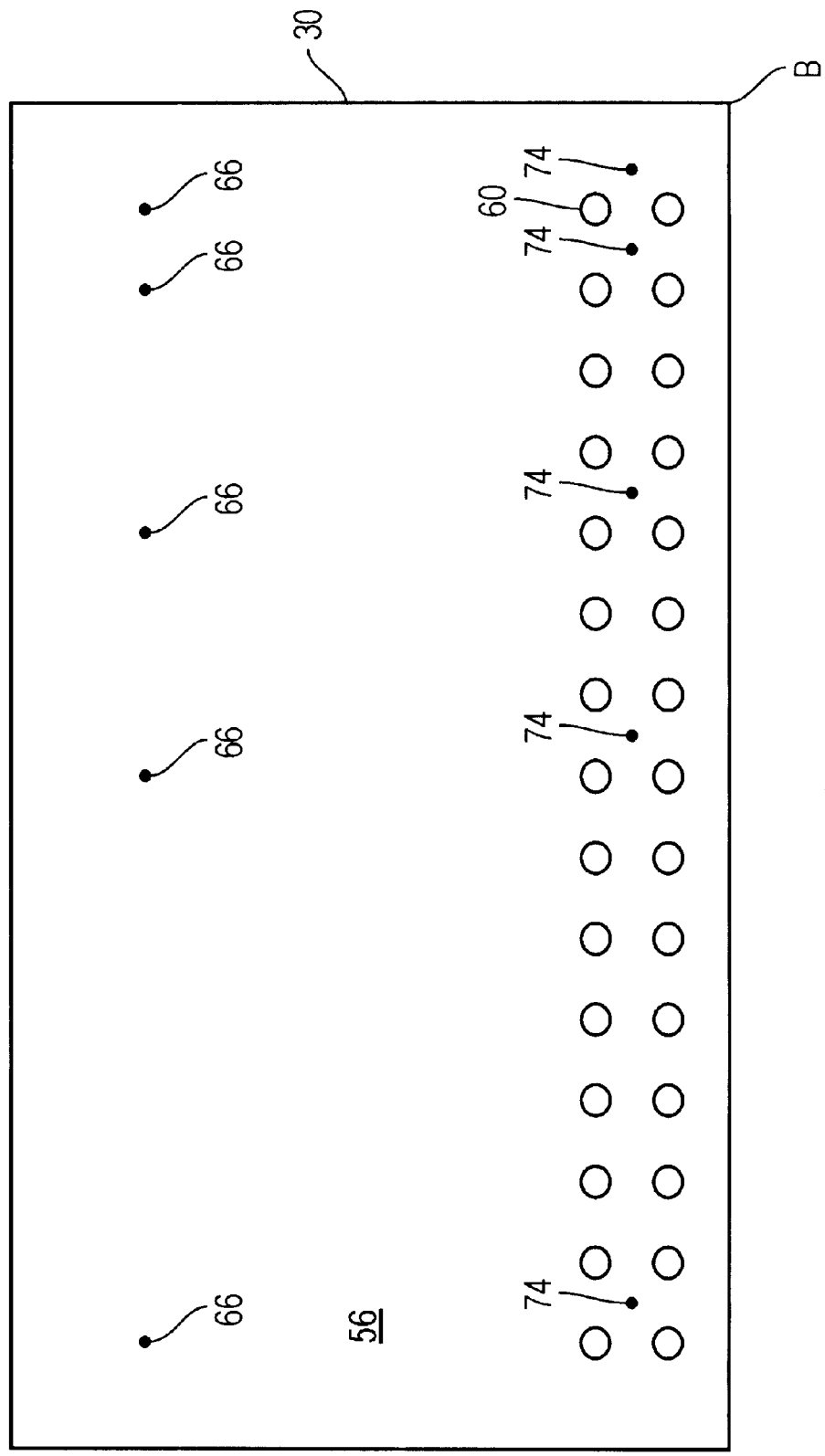
FIG. 10 depicts an intermediate layer of a flex circuit employed in a preferred embodiment of the present invention.
Figure 11:
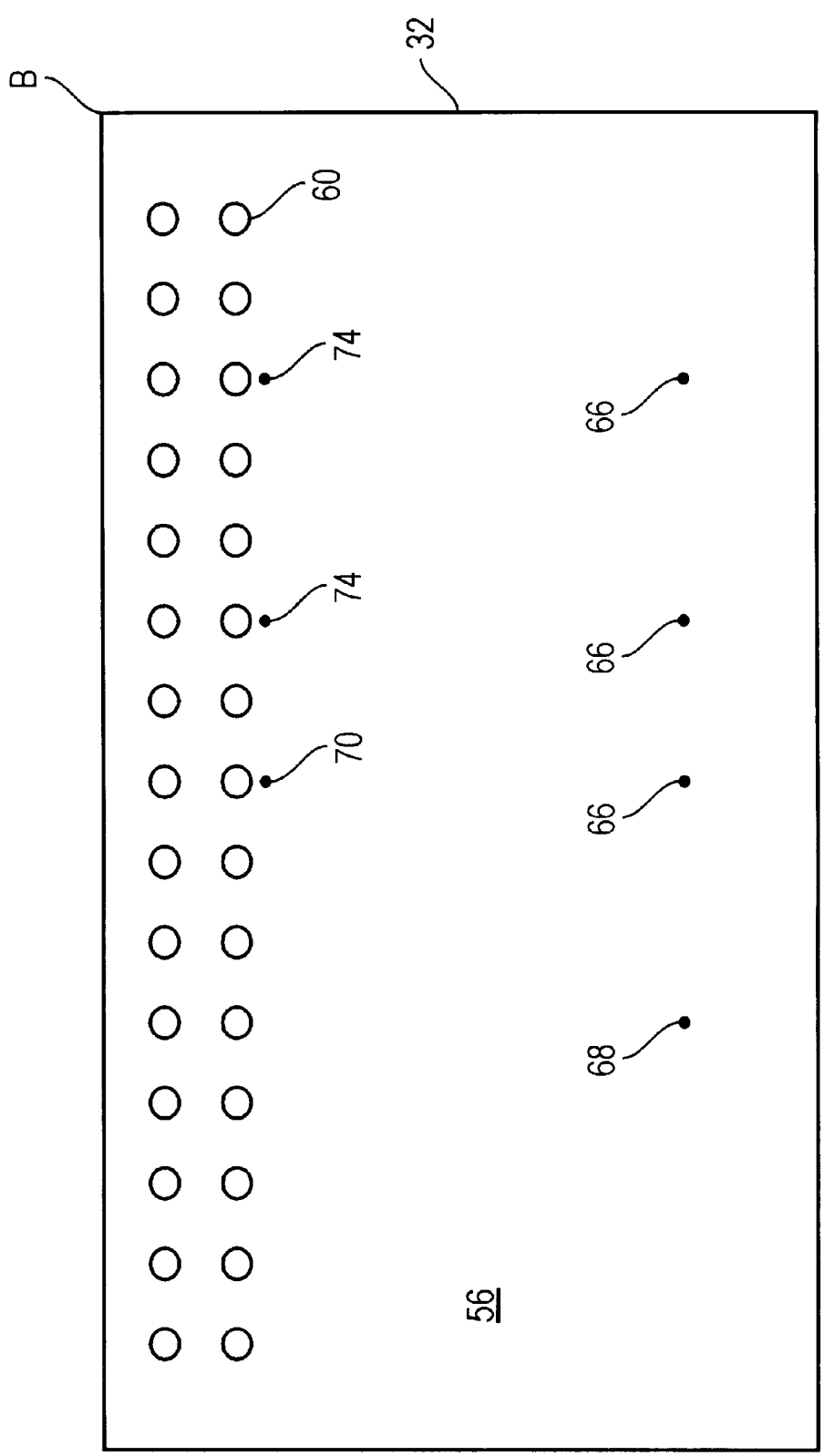
FIG. 11 depicts an intermediate layer of a right side flex circuit employed in a preferred embodiment of the present invention.

FIG. 10 depicts intermediate layer 56 of flex 30. Windows 60 are shown opened in intermediate surface 56. CSP contacts 24 of lower CSP 14 pass through windows 60 in intermediate layer 58 to reach lower flex contacts 44 at the level of second conductive layer 58. Those of skill will notice that, in the depicted preferred embodiment, windows 60 narrow in diameter from their manifestation in first outer layer 50. Vias 66, off-pad vias 74, and enable vias 68 and 70 pass through intermediate layer 56 connecting selected conductive areas at the level of first and second conductive layers 54 and 58, respectively. FIG. 11 depicts intermediate layer 56 of flex 32 showing windows 60, vias 66, off-pad vias 74, and enable vias 68 and 70 passing through intermediate layer 56.

Figure 12:
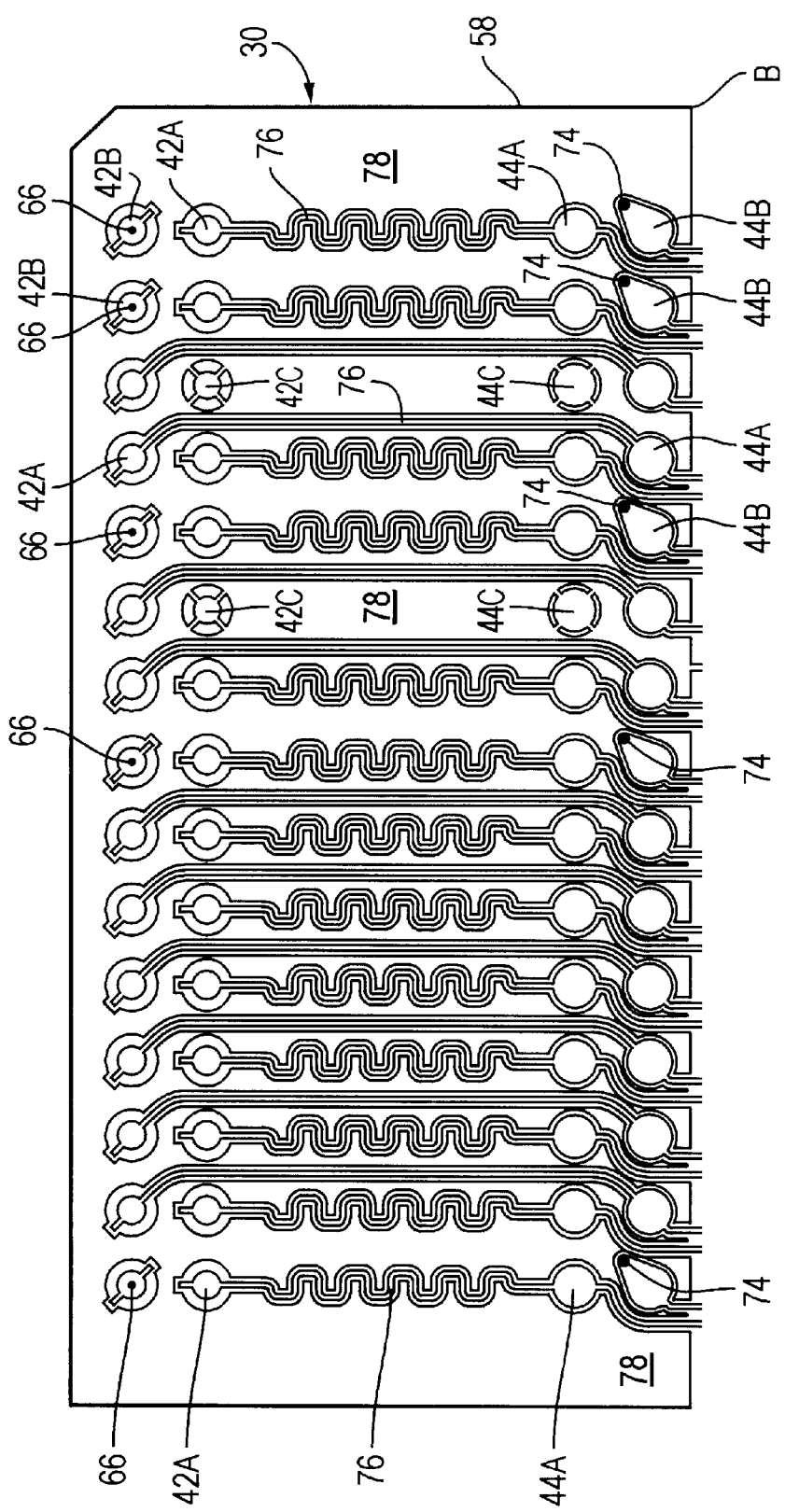
FIG. 12 depicts a second conductive layer of a flex circuit of a preferred embodiment of the present invention.

FIG. 12 depicts second conductive layer 58 of flex 30 of a preferred embodiment of the present invention. Depicted are various types of upper flex contacts 42, various types of lower flex contacts 44, signal traces 76, and VDD plane 78 as well as previously described vias 66 and off-pad vias 74. Throughout FIGS. 12 and 13, only exemplars of particular features are identified to preserve clarity of the view. Flex contacts 44A are connected to corresponding selected upper flex contacts 42A with signal traces 76. To enhance the clarity of the view, only exemplar individual flex contacts 44A and 42A are literally identified in FIG. 12. As shown, in this preferred embodiment, signal traces 76 exhibit path routes determined to provide substantially equal signal lengths between corresponding flex contacts 42A and 44A. As shown, traces 76 are separated from the larger surface area of second conductive layer 58 that is identified as VDD plane 78. VDD plane 78 may be in one or more delineated sections but, preferably is one section. Lower flex contacts 44C provide connection to VDD plane 78. In a preferred embodiment, upper flex contacts 42C and lower flex contacts 44C connect upper CSP 12 and lower CSP 14, respectively, to VDD plane 78. Lower flex contacts 44 that are connected to first conductive layer 54 by off-pad vias 74 are identified as lower flex contacts 44B. To enhance the clarity of the view, only exemplar individual lower flex contacts 44B are literally identified in FIG. 12. Upper flex contacts 42 that are connected to first conductive layer 54 by vias 66 are identified as upper flex contacts 42B.

Figure 13:
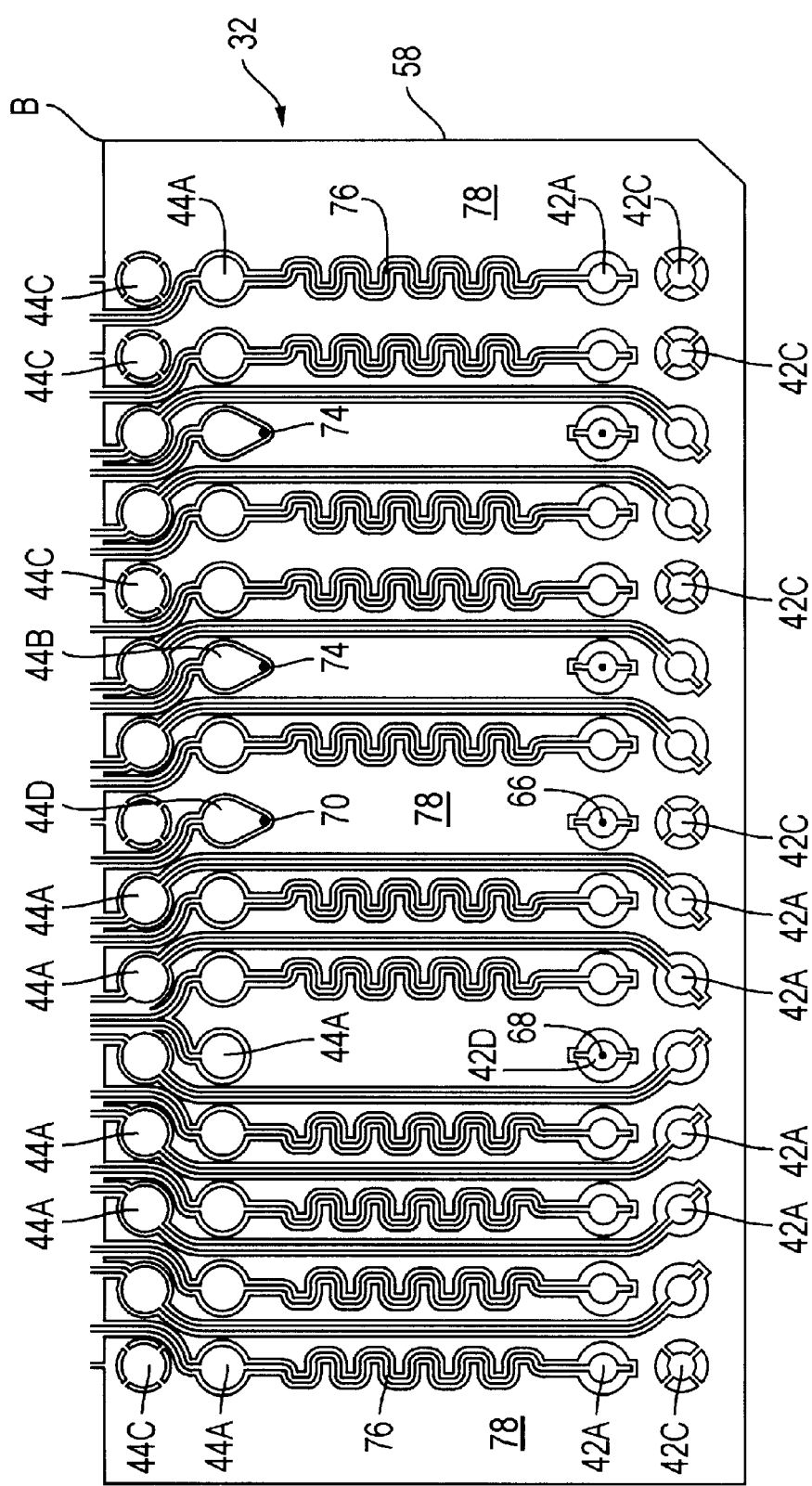
FIG. 13 depicts a second conductive layer of a flex circuit of a preferred embodiment of the present invention.

FIG. 13 depicts second conductive layer 58 of right side flex 32 of a preferred embodiment of the present invention. Depicted are various types of upper flex contacts 42, various types of lower flex contacts 44, signal traces 76, and VDD plane 78 as well as previously described vias 66, off-pad vias 74, and enable vias 70 and 68. FIG. 13 illustrates upper flex contacts 42A connected by traces 76 to lower flex contacts 44A. VDD plane 78 provides a voltage plane at the level of second conductive layer 58. Lower flex contacts 44C and upper flex contacts 42C connect lower CSP 14 and upper CSP 12, respectively, to VDD plane 78. Lower flex contact 44D is shown with enable via 70 described earlier. Corresponding upper flex contact 42D is connected to lower flex contact 44D through enable vias 70 and 68 that are connected to each other through earlier described enable trace 72 at the first conductive layer 54 level of flex 32.

Figure 14:
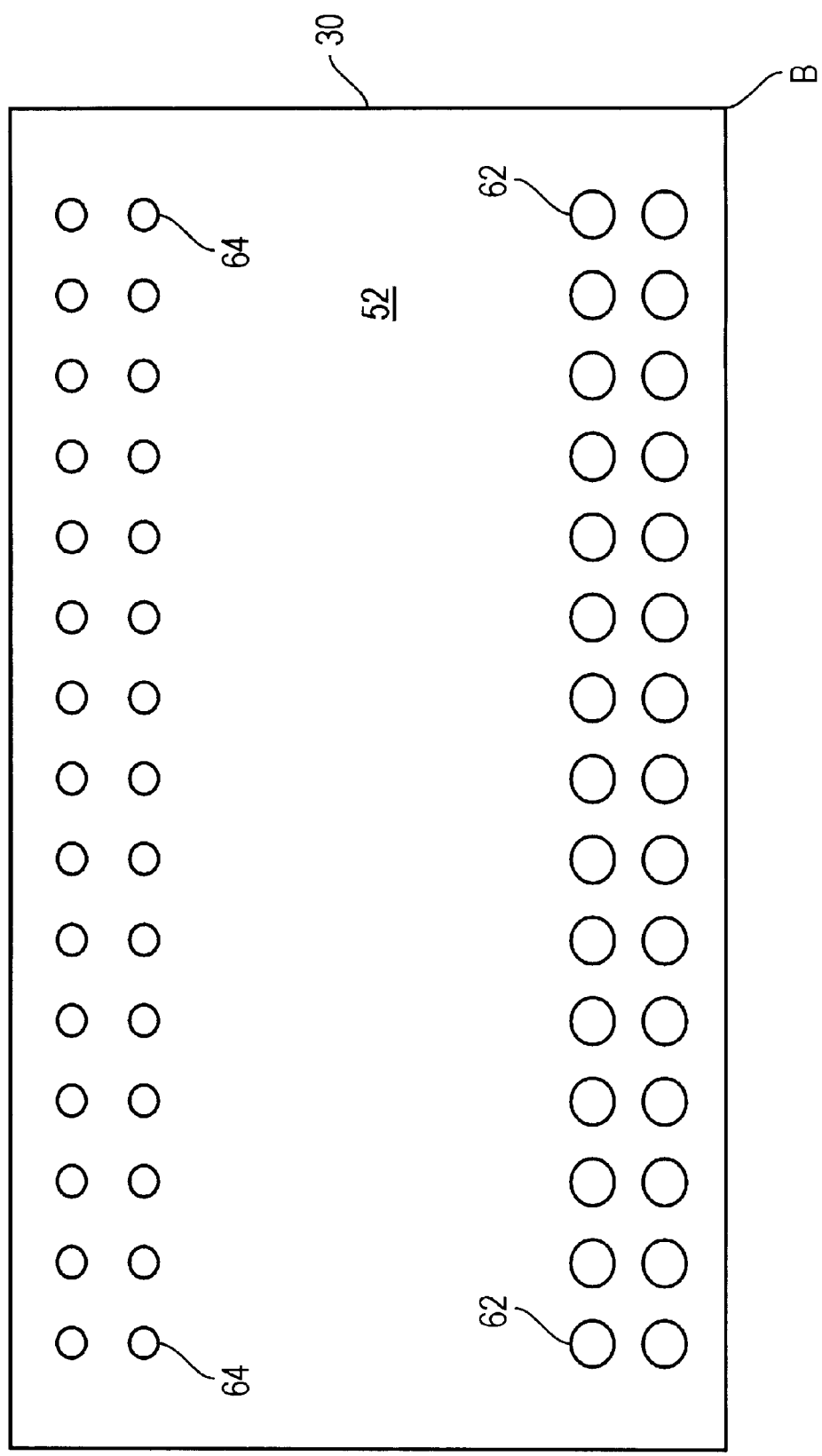
FIG. 14 depicts a second outer layer of a flex circuit employed in a preferred embodiment of the present invention.
Figure 15:
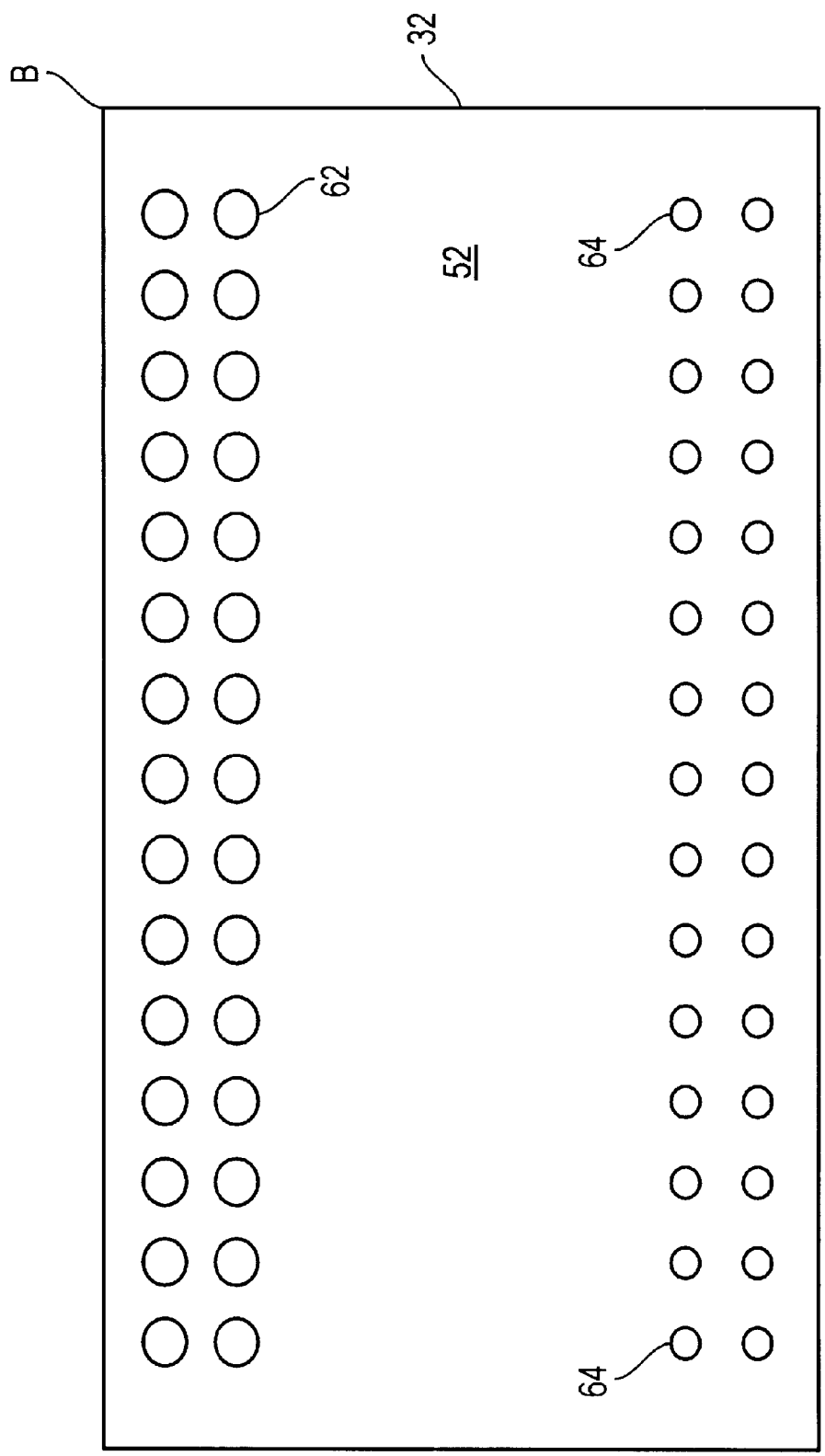
FIG. 15 reflects a second outer layer of a flex circuit employed in a preferred embodiment of the present invention.

FIG. 14 depicts second outer layer 52 of flex 30. Windows 62 are identified. Those of skill will recognize that module contacts 36 pass through windows 62 to contact appropriate lower flex contacts 44. When flex 30 is partially wrapped about lateral side 20 of lower CSP 14, a portion of second outer layer 52 becomes the upper-most layer of flex 30 from the perspective of upper CSP 12. CSP contacts 24 of upper CSP 12 pass through windows 64 to reach second conductive layer 58 and make contact with appropriate ones of upper flex contacts 42 located at that level. FIG. 15 reflects second outer layer 52 of flex 32 and exhibits windows 64 and 62. Module contacts 36 pass through windows 62 to contact appropriate lower flex contacts 44. CSP contacts 24 of upper CSP 12 pass through windows 64 to reach second conductive layer 58 and make contact with appropriate ones of upper flex contacts 42 located at that level.

Figure 16:
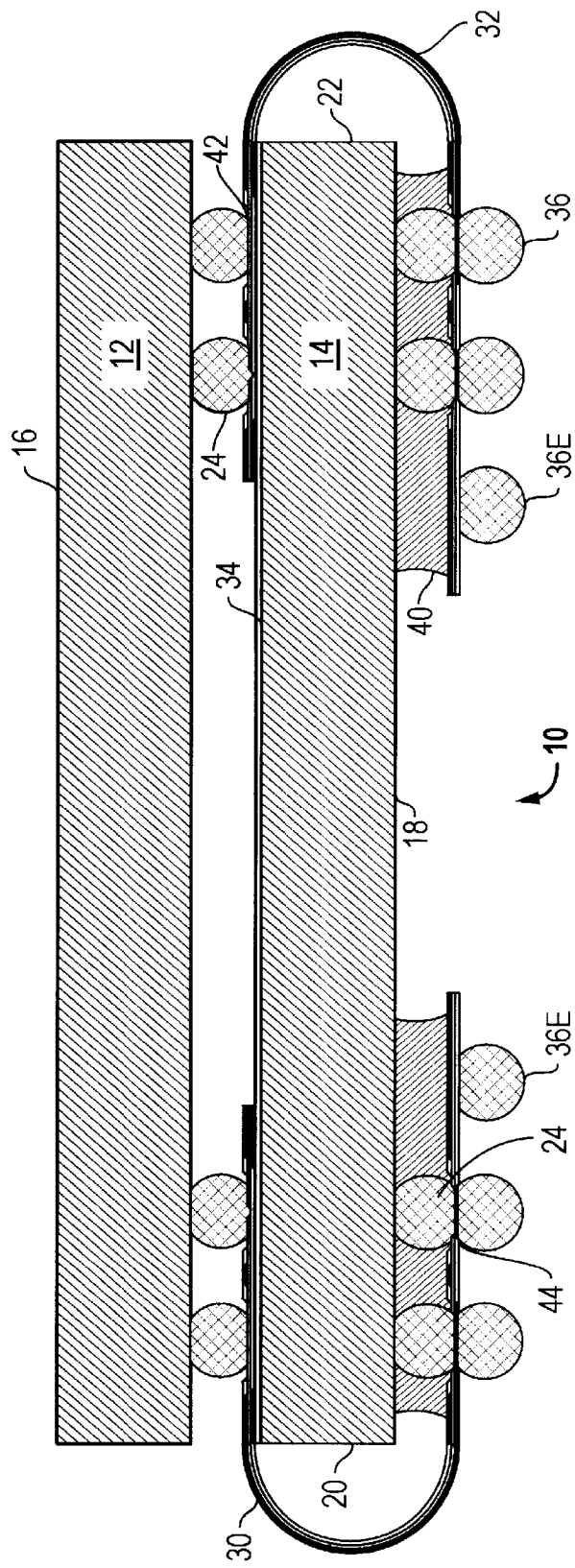
FIG. 16 depicts an alternative preferred embodiment of the present invention.

FIG. 16 depicts an alternative preferred embodiment of the present invention showing module 10. Those of skill will recognize that the embodiment depicted in FIG. 16 differs from that in FIG. 2 by the presence of module contacts 36E. Module contacts 36E supply a part of the datapath of module 10 and may provide a facility for differential enablement of the constituent CSPs. A module contact 36E not employed in wide datapath provision may provide a contact point to supply an enable signal to differentially enable upper CSP 12 or lower CSP 14.

In a wide datapath module 10, the data paths of the constituent upper CSP 12 and lower CSP 14 are combined to provide a module 10 that expresses a module datapath that is twice the width of the datapaths of the constituent CSPs in a two-high module 10. The preferred method of combination is concatenation, but other combinations may be employed to combine the datapaths of CSPs 12 and 14 on the array of module contacts 36 and 36E.

As an example, FIGS. 17, 18, and 19 are provided to illustrate using added module contacts 36E in alternative embodiments of the present invention to provide wider datapaths for module 10 than are present in constituent CSPs 12 and 14. FIG. 17 illustrates a JEDEC pinout for DDR-II FBGA packages. FIG. 18 illustrates the pinout provided by module contacts 36 and 36E of a module 10 expressing an 8-bit wide datapath. Module 10 is devised in accordance with the present invention and is, in the exemplar embodiment, comprised of an upper CSP 12 and lower CSP 14 that are DDR-II-compliant in timing, but each of which are only 4 bits wide in datapath. As will be recognized, the module 10 mapped in FIG. 18 expresses an 8-bit wide datapath. For example, FIG. 18 depicts DQ pins differentiated in source between upper CSP 12 ("top") and lower CSP 14 ("bot") to aggregate to 8-bits. FIG. 19 illustrates the pinout provided by module contacts 36 and 36E of module 10 expressing a 16-bit wide datapath. Module 10 is devised in accordance with the present invention and is, in this exemplar embodiment, comprised of an upper CSP 12 and lower CSP 14 that are DDR-II-compliant in timing, but each of which are only 8-bits wide in datapath. Those of skill in the art will recognize that the wide datapath embodiment may be employed with any of a variety of CSPs available in the field and such CSPs need not be DDR compliant.

Figure 20:
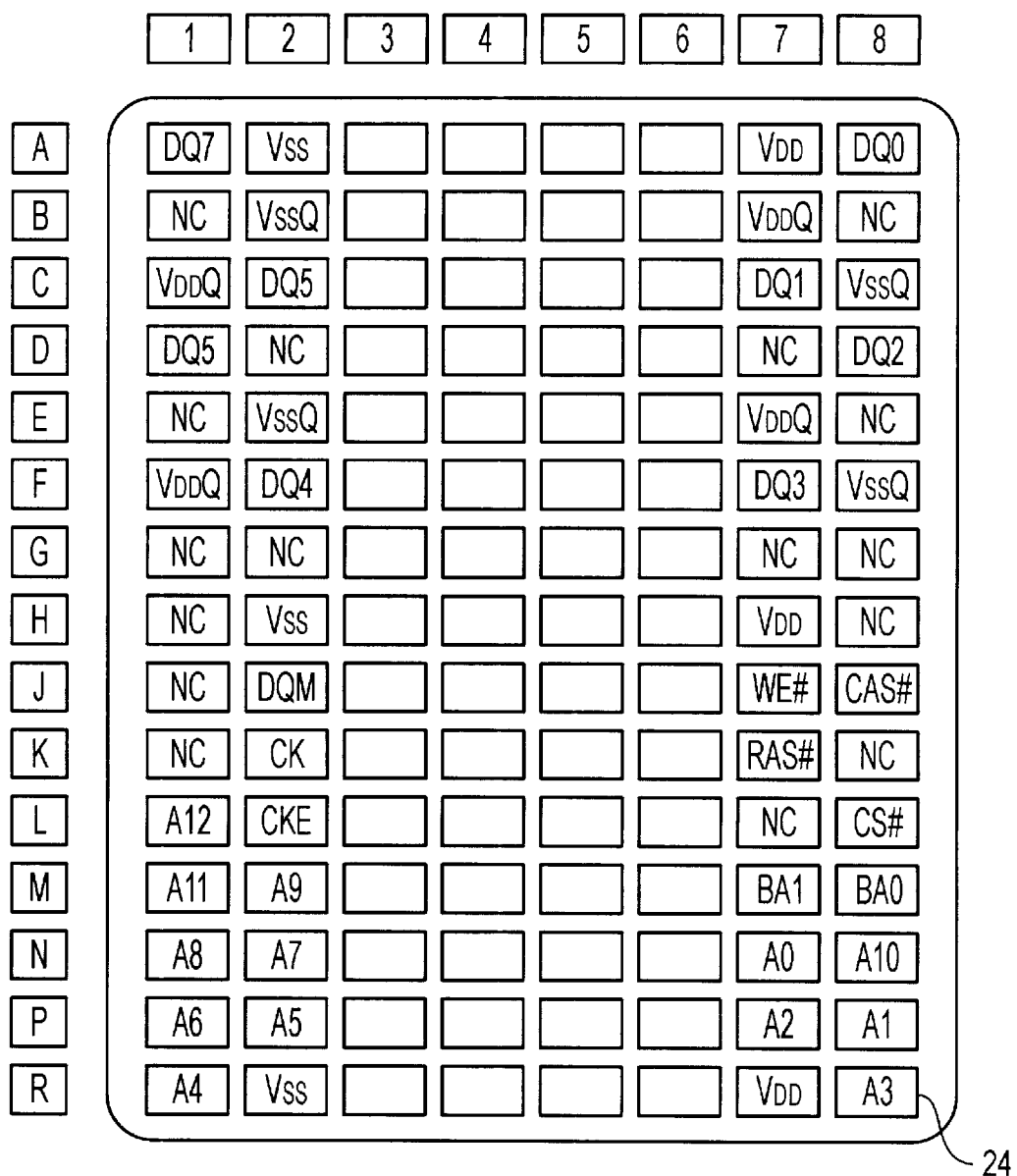
FIG. 20 depicts the pinout of an exemplar CSP employed in a preferred embodiment of the invention.
Figure 21:
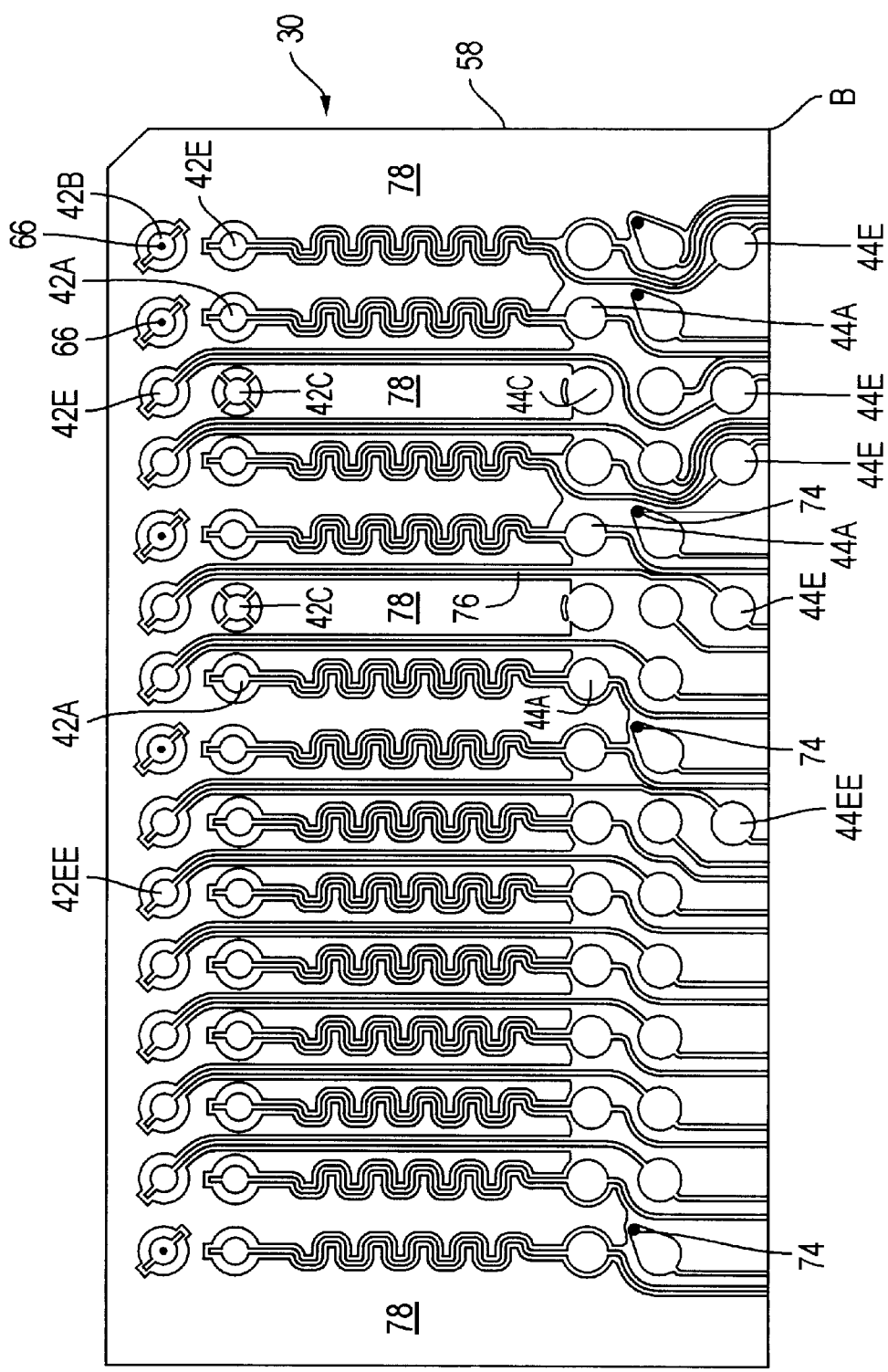
FIG. 21 depicts a second conductive layer of a flex circuit employed in an alternative preferred embodiment of the present invention.

FIG. 20 illustrates a typical pinout of a memory circuit provided as a CSP and useable in the present invention. Individual array positions are identified by the JEDEC convention of numbered columns and alphabetic rows. The central area (e.g., A3–A6; B3–B6; etc.) is unpopulated. CSP contacts 24 are present at the locations that are identified by alpha-numeric identifiers such as, for example, A3, shown as an example CSP contact 24. FIG. 21 depicts second metal layer 58 of flex 30 in an alternative embodiment of the invention in which module 10 expresses a datapath wider than that expressed by either of the the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 21, lower flex contacts 44E are connected to upper flex contacts 42E. As shown in earlier FIG. 14, windows 62 pass through second outer layer 52. In the alternative preferred embodiment for which second conductive layer 58 is shown in FIG. 21, module contacts 36 and 36E pass through windows 62 in second outer layer 52 of flex circuit 30, to contact appropriate lower flex contacts 44.

Figure 22:
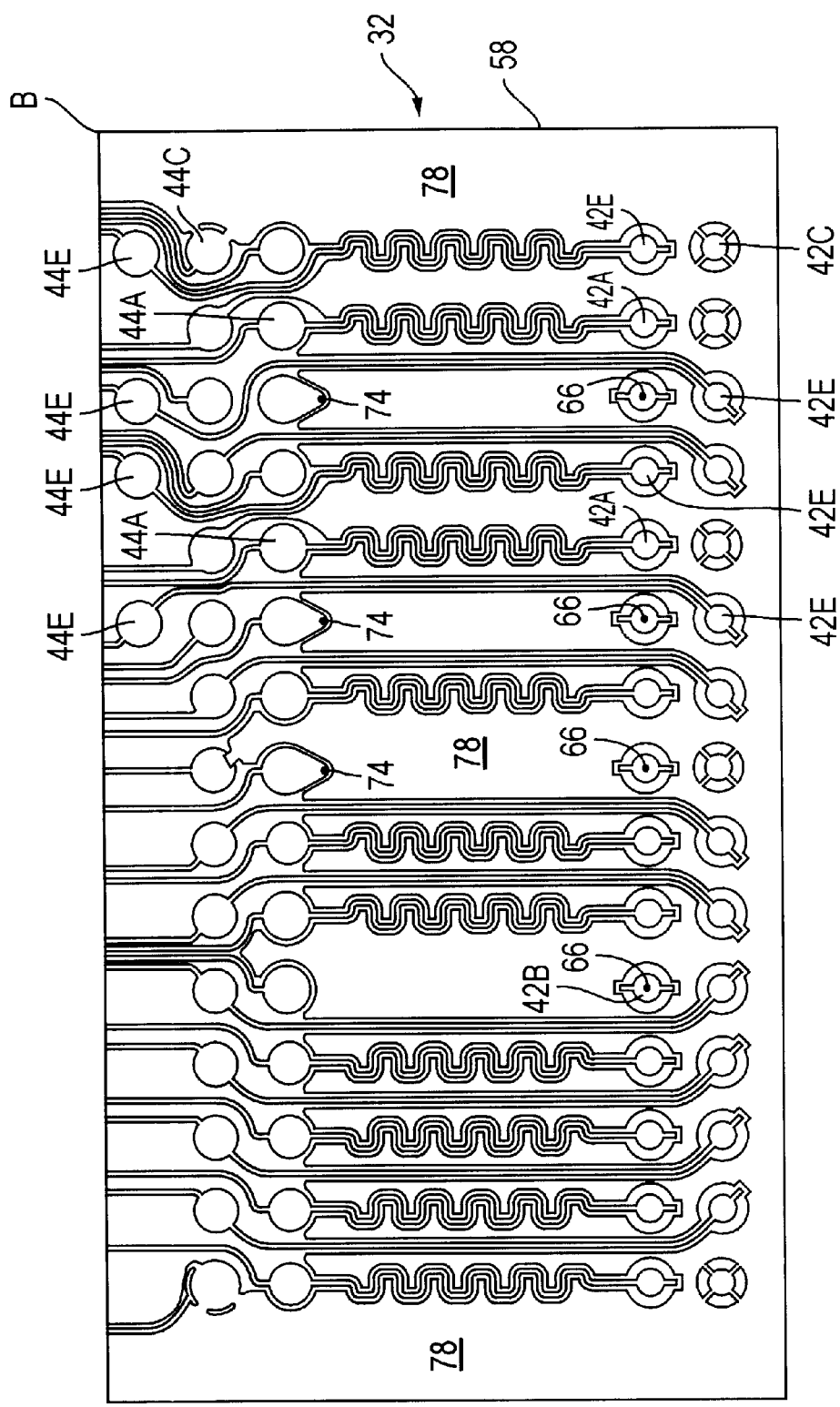
FIG. 22 depicts a second conductive layer of a flex circuit employed in an alternative preferred embodiment of the present invention.

FIG. 22 illustrates second metal layer 58 of flex 32 in an alternative embodiment of the invention in which module 10 expresses a datapath wider than that expressed by either of the the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 22, lower flex contacts 44E are connected to upper flex contacts 42E. As shown in earlier FIG. 14, windows 62 pass through second outer layer 52. In the alternative preferred embodiment for which second conductive layer 58 is shown in FIG. 22, module contacts 36 pass through windows 62 in second outer layer 52 of flex circuit 32, to contact appropriate lower flex contacts 44.

In particular, in the embodiment depicted in FIGS. 21 and 22, module contacts 36E contact flex contacts 44E and 44EE. Those of skill will recognize that lower flex contacts 44E are, in the depicted embodiment, eight (8) in number and that there is another lower flex contacts identified by reference 44EE shown on FIG. 21. Lower flex contact 44EE is contacted by one of the module contacts 36E to provide differential enablement between upper and lower CSPs. Those of skill will recognize that lower flex contacts 44E are connected to corresponding upper flex contacts 42E. CSP contacts 24 of upper CSP 12 that convey data are in contact with upper flex contacts 42E. Consequently, the datapaths of both upper CSP 12 and lower CSP 14 are combined to provide a wide datapath on module 10. With the depicted connections of FIGS. 21 and 22, lower flex contacts 44E of flex circuits 30 and 32 convey to module contacts 36E, the datapath of upper CSP 12, while other lower flex contacts 44 convey the datapath of lower CSP 14 to module contacts 36 to provide module 10 with a module datapath that is the combination of the datapath of upper CSP 12 and lower CSP 14. In the depicted particular embodiment of FIGS. 21 and 22, module 10 expresses a 16-bit datapath and CSP 12 and CSP 14 each express an 8-bit datapath.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

What is claimed is:

1. A high-density circuit module comprising:

a first flex circuit having first and second conductive layers between which conductive layers is an intermediate layer, the first and second conductive layers being interior to first and second outer layers of the first flex circuit, the second conductive layer having upper and lower flex contacts, the upper flex contacts being accessible through second CSP windows through the second outer layer and the lower flex contacts being accessible through first CSP windows through the first outer layer, the first conductive layer and the intermediate layer, the lower flex contacts being further accessible through module contact windows through the second outer layer;

a second flex circuit having first and second conductive layers between which conductive layers is an intermediate layer, the first and second conductive layers being interior to first and second outer layers of the second flex circuit, the second conductive layer having upper and lower flex contacts, the upper flex contacts being accessible through second CSP windows through the second outer layer and the lower flex contacts being accessible through first CSP windows through the first outer layer and the first conductive layer and the intermediate layer, the lower flex contacts being further accessible through module contact windows through the second outer layer;

a first CSP having first and second lateral sides and upper and lower major surfaces with CSP contacts along the lower major surface, the CSP contacts of the first CSP passing through the first CSP windows of the first and second flex circuits to contact the lower flex contacts of the first and second flex circuits;

a second CSP having first and second lateral sides and upper and lower major surfaces with CSP contacts along the lower major surface, the CSP contacts of the second CSP passing through the second CSP windows of the first and second flex circuits to contact the upper flex contacts of the first and second flex circuits, the first and second flex circuits being disposed about the first and second lateral sides, respectively, of the first CSP to place the upper flex contacts of the first and second flex circuits between the first and second CSPs; and a set of module contacts passing through the module contact windows to contact the lower flex contacts of the first and second flex circuits.

2. The high-density circuit module of claim 1 in which a ground set of the upper flex contacts and a ground set of the lower flex contacts connect ground-conductive CSP contacts of the first and second CSPs to the first conductive layer.

3. The high-density circuit module of claim 2 in which:

a data set of the CSP contacts of the first CSP express an n-bit datapath;

a data set of the CSP contacts of the second CSP express an n-bit datapath; and a data set of module contacts comprised of selected ones of the set of module contacts and a set of supplemental module contacts, and the data set of module contacts expresses a 2n-bit datapath that combines the n-bit datapath of the data set of the CSP contacts of the first CSP and the n-bit datapath of the data set of the CSP contacts of the second CSP.

4. The high-density circuit module of claim 2 in which the ground set of the upper flex contacts and the ground set of the lower flex contacts are connected to the first conductive layer with vias.

5. The high-density circuit module of claim 4 in which the ground set of lower flex contacts are connected to the first conductive layer with vias that are off-pad.

6. The high-density circuit module of claim 1 or 2 in which the second conductive layer comprises at least one demarked voltage plane and a voltage set of the upper flex contacts and a voltage set of the lower flex contacts connect voltage conductive CSP contacts of the first and second CSPs to one of the at least one voltage planes.

7. A flex circuit connecting two CSPs in a high-density circuit module, the flex circuit comprising;

first and second outer layers; and first and second conductive layers, between which there is an intermediate layer, the first and second conductive layers and the intermediate layer being interior to the first and second outer layers, the second conductive layer having demarked first and second flex contacts and a conductive plane, the first flex contacts being accessible through first windows through the second outer layer and the second flex contacts being accessible through second windows through the first outer layer, the first conductive layer, and the intermediate layer, the first flex contacts in electrical connection with one of the two CSPs and the second flex contacts in electrical connection with the other of the two CSPs.

8. The flex circuit of claim 7 in which the second flex contacts are accessible through module windows through the second outer layer.

9. The flex circuit of claim 7 in which the first and second conductive layers are metal.

10. The flex circuit of claim 7 in which selected ones of the first flex contacts are connected to selected ones of the second flex contacts.

11. The flex circuit of claim 7 in which selected ones of the first flex contacts and selected ones of the second flex contacts are connected to the first conductive layer.

12. The flex circuit of claim 9 in which the metal of the first and second conductive layers is alloy 110.

13. The flex circuit of claim 10 in which the connected selected ones of the first and second flex contacts are connected with traces.

14. The flex circuit of claim 11 in which selected ones of the first flex contacts and selected ones of the second flex contacts are connected to the first conductive layer with vias.

15. The flex circuit of claim 14 in which selected ones of the first flex contacts are connected to the first conductive layer with on-pad vias.

16. The flex circuit of claim 14 in which selected ones of the second flex contacts are connected to the first conductive layer with off-pad vias.

17. A high-density circuit module that employs the flex circuit of claim 7 to connect selected contacts of a first CSP to selected contacts of a second CSP, the first and second CSPs being in stacked conjunction with each other and there being a conformal medium between the first outer surface of the flex circuit and a major surface of the second CSP.

18. A high-density circuit module comprising:

a first flex circuit devised in accordance with claim 7;

a second flex circuit devised in accordance with claim 7;

a first CSP having CSP contacts, the CSP contacts of the first CSP passing through the first windows to contact the first flex contacts of each of the first and second flex circuits;

a second CSP having CSP contacts, the first CSP being disposed above the second CSP and the CSP contacts of the second CSP passing through the second windows to contact the second flex contacts of each of the first and second flex circuits; and a set of module contacts in contact with the second flex contacts.

19. A high-density circuit module comprising:

a first flex circuit devised in accordance with claim 7;

a second flex circuit devised in accordance with claim 7;

a first CSP having CSP contacts, the CSP contacts of the first CSP passing through the second windows to contact the second flex contacts of each of the first and second flex circuits;

a second CSP having CSP contacts, the first CSP being disposed above the second CSP and the CSP contacts of the second CSP passing through the first windows to contact the first flex contacts of each of the first and second flex circuits; and a set of module contacts in contact with the first flex contacts.

20. The high-density module of claim 18 or 19 in which for the first and second flex circuits, the first conductive layer conveys ground, and the conductive plane of the second conductive layer conveys voltage and the intermediate layer is insulative to create a distributed capacitor in the first and second flex circuits.

21. A high-density circuit module comprising:

a first CSP having an n-bit wide datapath;

a second CSP having an n-bit wide datapath, the first CSP being disposed above the first CSP;

a pair of flex circuits that collectively combine the n-bit wide datapaths of the first and second CSPs to provide on a set of module contacts, a module datapath that is 2n-bits wide.

22. The high-density circuit module of claim 21 in which the flex circuits that comprise the pair of flex circuits are each iterations of the flex circuit of claim 7.

23. A high-density circuit module comprising:

a first CSP having first and second lateral sides and upper and lower major surfaces and a set of CSP contacts along the lower major surface;

a second CSP having first and second lateral sides and upper and lower major surfaces and a set of CSP contacts along the lower major surface, the first CSP being disposed above the second CSP;

a pair of flex circuits, each of which pair having a first conductive layer and a second conductive layer, both said conductive layers being interior to first and second outer layers, and demarcated at the second conductive layer of each flex circuit there being upper and lower flex contacts, the upper flex contacts being connected to the CSP contacts of the first CSP and the lower flex contacts being connected to the CSP contacts of the second CSP and a set of module contacts.

24. The high-density circuit module of claim 23 in which:

a chip-enable module contact is connected to an enable lower flex contact that is connected to a chip select CSP contact of the first CSP.

25. The high-density circuit module of claim 24 in which the connection between the enable lower flex contact and the chip select CSP contact of the first CSP is through an enable connection at the first conductive layer.

26. The high-density circuit module of claim 23 in which a first one of the flex circuit pair is partially wrapped about the first lateral side of the second CSP and a second one of the flex circuit pair is partially wrapped about the second lateral side of the second CSP to dispose the upper flex contacts above the upper major surface of the second CSP and beneath the lower major surface of the first CSP.

27. The high-density circuit module of claim 26 in which there is thermally conductive material between the first and second CSPs.

28. The high-density circuit module of claim 26 in which the first CSP expresses an n-bit datapath and the second CSP expresses an n-bit datapath, each of the flex circuits of the flex circuit pair having supplemental lower flex contacts which, in combination with the lower flex contacts, provide connection for the set of module contacts and a set of supplemental module contacts to express a 2n-bit module datapath that combines the n-bit datapath expressed by the first CSP and the n-bit datapath expressed by the second CSP.

29. A high-density circuit module comprising:

a first CSP having first and second major surfaces with a plurality of CSP contacts along the first major surface;

a second CSP having first and second major surfaces with a plurality of CSP contacts along the first major surface, the first CSP being disposed above the second CSP;

a pair of flex circuits, each of which has an outer layer and an inner layer and first and second conductive layers between which conductive layers there is an intermediate layer, the second conductive layer having demarked a plurality of upper and lower flex contacts and a voltage plane, a first set of said plurality of upper and lower flex contacts being connected to the voltage plane, a second set of said plurality of upper and lower flex contacts being connected to the first conductive layer, and a third set of said plurality of upper and lower flex contacts being comprised of selected ones of upper flex contacts that are connected to corresponding selected ones of lower flex contacts, the plurality of CSP contacts of the first CSP being in contact with the upper flex contacts and the plurality of CSP contacts of the second CSP being in contact with the lower flex contacts; and a set of module contacts in contact with the lower flex contacts.

30. The high density circuit module of claim 29 in which the first and second CSPs are memory circuits.

31. The high-density circuit module of claim 29 in which:

a data set of the plurality of CSP contacts of the first CSP express an n-bit datapath;

a data set of the plurality of CSP contacts of the second CSP express an n-bit datapath:

each of the flex circuits of the pair of flex circuits has supplemental lower flex contacts which, in combination with the lower flex contacts, provide connection for the set of module contacts and a set of supplemental module contacts to express a 2n-bit module datapath that combines the n-bit datapath expressed by the data set of the plurality of CSP contacts of the first CSP and the n-bit datapath expressed by the data set of the plurality of CSP contacts of the second CSP.

32. The high-density circuit module of claim 29 in which the second set of said plurality of upper and lower flex contacts is connected to the first conductive layer with vias that pass through the intermediate layer.

33. The high-density circuit module of claim 32 in which the second set of said plurality of upper and lower flex contacts is comprised of upper flex contacts connected to the first conductive layer with on-pad vias.

34. The high-density circuit module of claim 32 in which the second set of said plurality of upper and lower flex contacts is comprised of lower flex contacts connected to the first conductive layer with off-pad vias.

35. The high-density circuit module of claim 29 in which the CSP contacts of the second CSP are spherical in shape and have a CSP contact diameter and the module contacts are spherical in shape and have a module contact diameter.

36. The high-density circuit module of claim 35 mounted on a board and the first major surface of the second CSP is offset from the board by a distance which is at least as great as the sum of the CSP contact diameter and the module contact diameter.

37. The high-density circuit module of claim 29, 30, 31 or 36 in which between the first and second CSPs there is a thermally conductive layer.

38. The high-density circuit module of claim 37 in which the thermally conductive layer is a thermally conductive adhesive that contacts, but does not cover the entirety of the second major surface of the second CSP.

39. A high-density circuit module comprising:

a first CSP having a set of first CSP contacts;

a second CSP having a set of second CSP contacts, the first CSP being disposed above the second CSP;

a pair of flex circuits, each of which flex circuits of the pair has first and second outer layers and a first conductive layer and a second conductive layer between which conductive layers there is an intermediate layer, the first and second conductive layers and the intermediate layer each being interior to the first and second outer layers, each of the flex circuits having first and second sets of flex contacts demarked at the first conductive layer, the first set of flex contacts being accessible through first CSP windows that pass through the second outer layer, the second conductive layer and the intermediate layer, the second set of flex contacts being accessible through second CSP windows that pass through the first outer layer and accessible through module contact windows that pass through the second outer layer, the second conductive layer and the intermediate layer, the second CSP contacts of the second CSP passing through the second CSP windows to contact the second set of flex contacts and the first CSP contacts of the first CSP passing through the first CSP windows to contact the first set of flex contacts; and a set of module contacts that pass through the module contact windows to contact the second set of flex contacts.

40. A high-density circuit module comprising:

a first CSP having a set of first CSP contacts;

a second CSP having a set of second CSP contacts, the first CSP being disposed above the second CSP;

a pair of flex circuits, each of which flex circuits of the pair has first and second outer layers and a first conductive layer and a second conductive layer between which conductive layers there is an intermediate layer, the first and second conductive layers and the intermediate layer each being interior to the first and second outer layers, each of the flex circuits having first and second sets of flex contacts demarked at the first conductive layer, the first set of flex contacts being accessible through first CSP windows that pass through the first outer layer, the second set of flex contacts being accessible through second CSP windows that pass through the second outer layer, the second conductive layer and the intermediate layer and the second set of flex contacts being accessible through module contact windows that pass through the first outer layer, the second CSP contacts of the second CSP passing through the second CSP windows to contact the second set of flex contacts and the first CSP contacts of the first CSP passing through the first CSP windows to contact the first set of CSP contacts; and a set of module contacts that pass through the module contact windows to contact the second set of flex contacts.

41. A method for assembling a high-density module of CSPs, the method comprising the steps of:

acquiring first and second flex circuits devised in accordance with claim 7;

disposing an adhesive on a selected area of the first outer surfaces of the first and second flex circuits proximal to the second windows of the first outer surfaces;

acquiring first and second CSPs, each having respective left and right lateral sides and upper and lower surfaces and CSP contacts emergent from their respective lower surfaces;

placing the CSP contacts of the second CSP through the second windows of the first and second flex circuits while contacting with the lower surface of the second CSP, the selected area of the first outer surfaces of the first and second flex circuits creating an adhesive contact between the second CSP and the first and second flex circuits and an electrical interconnection between the CSP contacts of the second CSP and the second flex contacts of the first and second flex circuits;

disposing an adhesive on the upper surface of the second CSP;

partially wrapping the first flex circuit about the left lateral side of the second CSP and partially wrapping the second flex circuit about the right lateral side of the second CSP and contacting the upper surface of the second CSP with a portion of the first outer surfaces of the first and second flex circuits creating an adhesive contact between the upper surface of the second CSP and the first outer surface of the first and second flex circuits;

disposing an adhesive on the second outer surface of the first and second flex circuits proximal to the first windows of the first and second flex circuits; and placing the CSP contacts of the first CSP through the first windows of the first and second flex circuits creating an electrical interconnection between the CSP contacts of the first CSP and the flex contacts of the first and second flex circuits.

42. The method of claim 41 in which the adhesive disposed proximal the first and second windows has flux properties.

* * * * *

UNITED STATES PATENT AND TRADEMARK OFFICE
CERTIFICATE OF CORRECTION

PATENT NO. : 6,576,992 B1  Page 1 of 1
DATED : June 10, 2003
INVENTOR(S) : Cady et al.

It is certified that error appears in the above-identified patent and that said Letters Patent is hereby corrected as shown below:

Column 1,
Line 33, delete "a"

Column 5,
Line 2, delete "ballgrid" and insert, therefore, -- ball grid. --

Column 18,
Line 41, between "the" and "flex" place the word "first", thus making line 41 read,
-- the first CSP and the first flex contacts of the first and second --

Signed and Sealed this

Twenty-third Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,576,992 B1
DATED : June 10, 2003
INVENTOR(S) : Cady et al.

It is certified that error appears in the above-identified patent and that said Letters Patent is hereby corrected as shown below:

<u>Column 14,</u>
Line 67, the word "first" should be deleted and replaced with the word -- second --

Signed and Sealed this

Twentieth Day of April, 2004

JON W. DUDAS
*Acting Director of the United States Patent and Trademark Office*